(12) United States Patent
Itou et al.

(10) Patent No.: US 9,804,435 B2
(45) Date of Patent: Oct. 31, 2017

(54) COLOR FILTER SUBSTRATE AND DISPLAY DEVICE

(71) Applicant: Japan Display Inc., Minato-ku (JP)

(72) Inventors: Osamu Itou, Tokyo (JP); Kenji Nakao, Tokyo (JP); Toshimasa Ishigaki, Tokyo (JP); Daisuke Sonoda, Tokyo (JP)

(73) Assignee: Japan Display Inc., Minato-ku (JP)

( * ) Notice: Subject to any disclaimer, the term of this patent is extended or adjusted under 35 U.S.C. 154(b) by 2 days.

(21) Appl. No.: 14/965,200

(22) Filed: Dec. 10, 2015

(65) Prior Publication Data

US 2016/0178963 A1 Jun. 23, 2016

(30) Foreign Application Priority Data

Dec. 17, 2014 (JP) .................................. 2014-255009

(51) Int. Cl.
| | | |
|---|---|---|
| *G02F 1/1335* | (2006.01) |
| *H01L 27/12* | (2006.01) |
| *G02F 1/1343* | (2006.01) |
| *G02F 1/1362* | (2006.01) |

(52) U.S. Cl.
CPC .. *G02F 1/133514* (2013.01); *G02F 1/134309* (2013.01); *H01L 27/1218* (2013.01); *G02F 2001/136222* (2013.01); *G02F 2201/52* (2013.01)

(58) Field of Classification Search
CPC ......... G02F 1/133377; G02F 1/133514; G02F 1/1341; G02F 1/136227; G02F 1/133345; G02F 1/136286

USPC ............... 349/43, 138; 257/72; 438/30, 149
See application file for complete search history.

(56) References Cited

U.S. PATENT DOCUMENTS

| | | | | |
|---|---|---|---|---|
| 6,031,512 A | 2/2000 | Kadota et al. | |
| 2005/0083452 A1* | 4/2005 | Rho | .................. | G02F 1/133514 349/106 |
| 2005/0231534 A1* | 10/2005 | Lee | ...................... | G09G 3/2003 345/690 |
| 2009/0059135 A1* | 3/2009 | Park | .................. | G02F 1/133555 349/96 |
| 2014/0184973 A1* | 7/2014 | Kim | .................. | G02F 1/136209 349/43 |
| 2014/0368773 A1* | 12/2014 | Okita | ................ | G02F 1/133514 349/106 |

(Continued)

FOREIGN PATENT DOCUMENTS

JP 11-24061 1/1999

*Primary Examiner* — Jonathan Han
(74) *Attorney, Agent, or Firm* — Oblon, McClelland, Maier & Neustadt, L.L.P.

(57) ABSTRACT

A color filter substrate includes an insulating substrate, a first pixel electrode, a second pixel electrode, a third pixel electrode, a first color filter disposed between the first pixel electrode and the insulating substrate, a second color filter disposed between the second pixel electrode and the insulating substrate, and a third color filter disposed between the third pixel electrode and the insulating substrate, wherein the first pixel electrode, the second pixel electrode, and the third pixel electrode are adjacent to each other, the first color filter has a first end, the second color filter has a second end, and the third color filter has a third end, and two of the first end, the second end, and the third end overlap in the first overlap area.

11 Claims, 20 Drawing Sheets

(56) References Cited

U.S. PATENT DOCUMENTS

2015/0177578 A1* 6/2015 Uramoto ........... G02F 1/133345
                                                                         349/34
2015/0207094 A1* 7/2015 Hwang ............... H01L 51/5203
                                                                         257/88

* cited by examiner

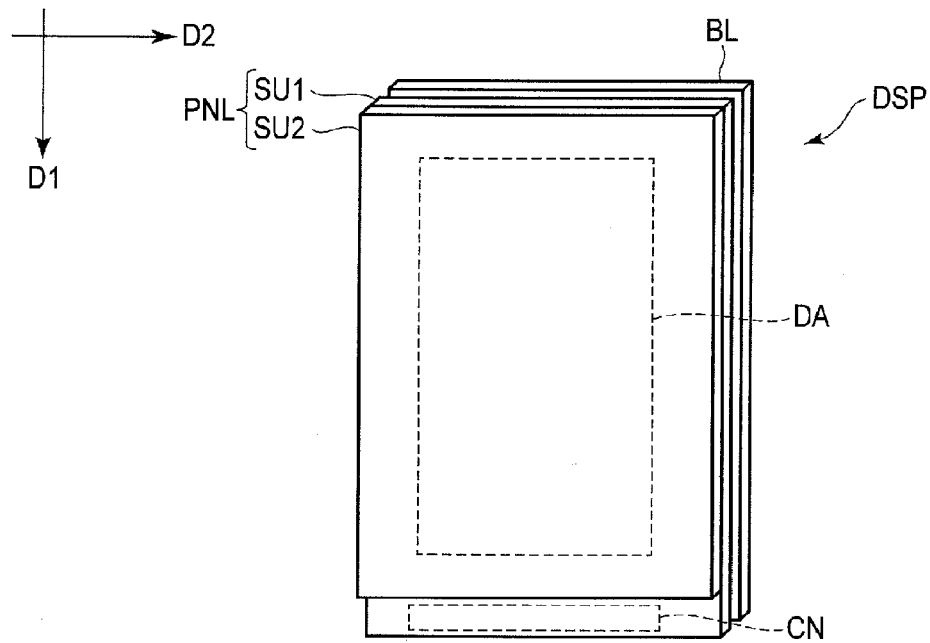
F I G. 1
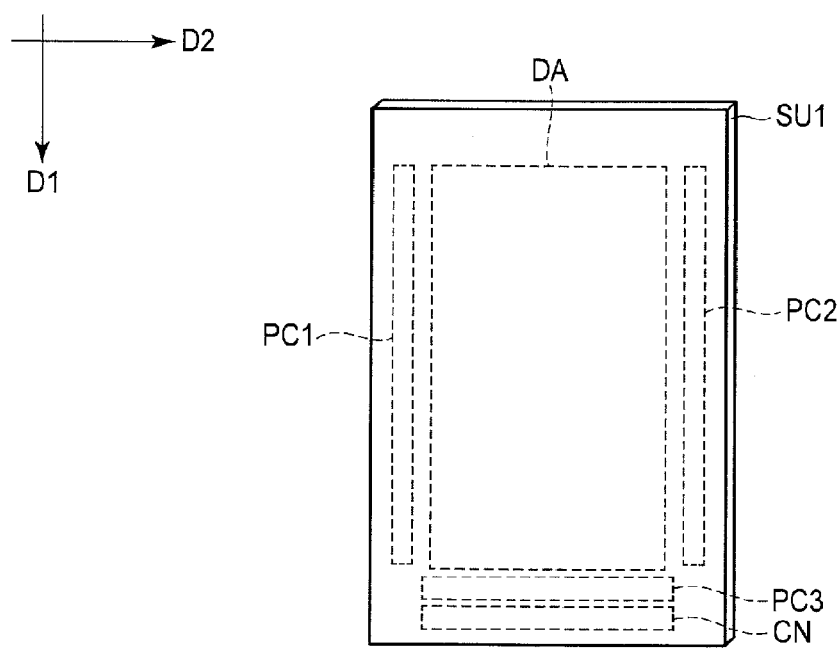
F I G. 2

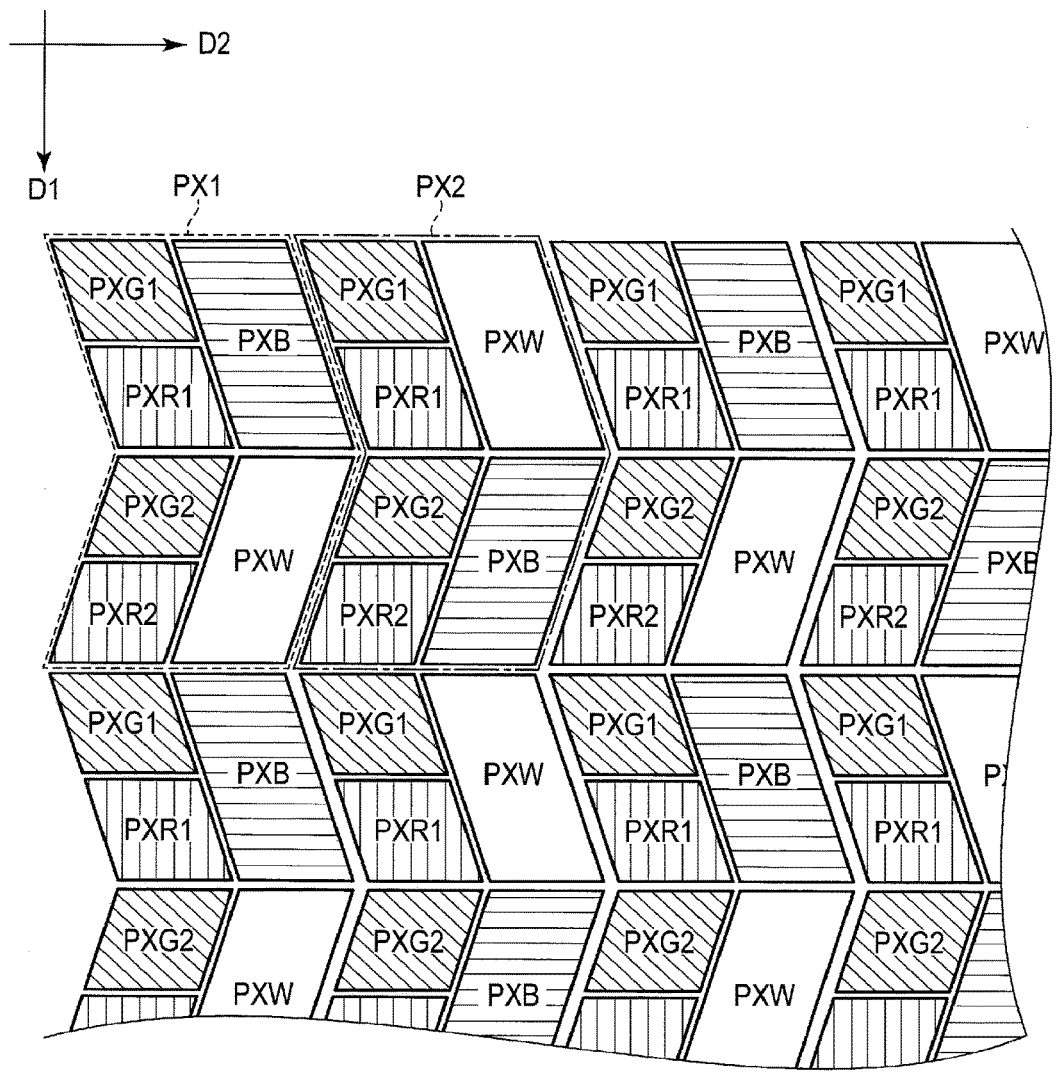
F I G. 3

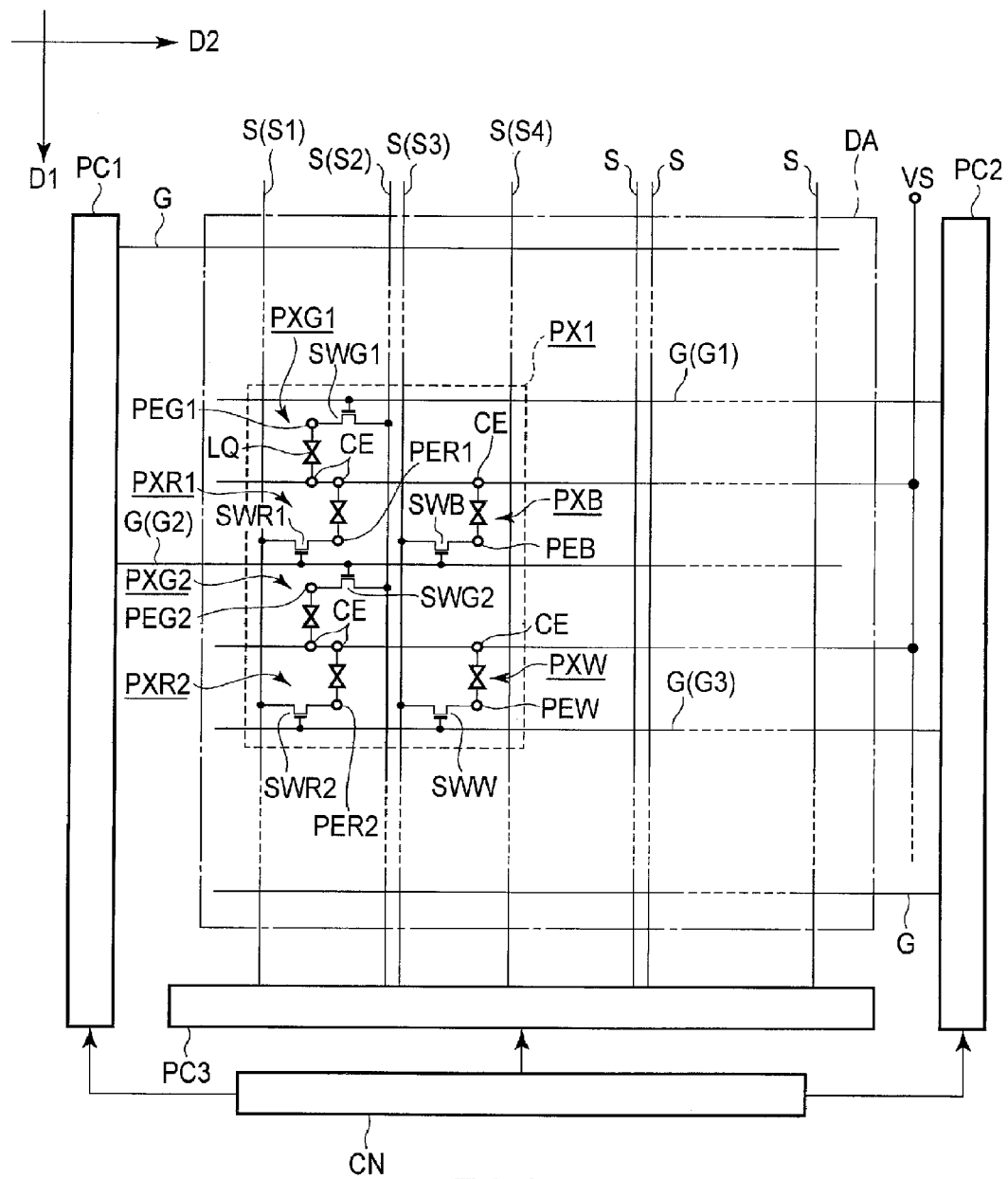
F I G. 4

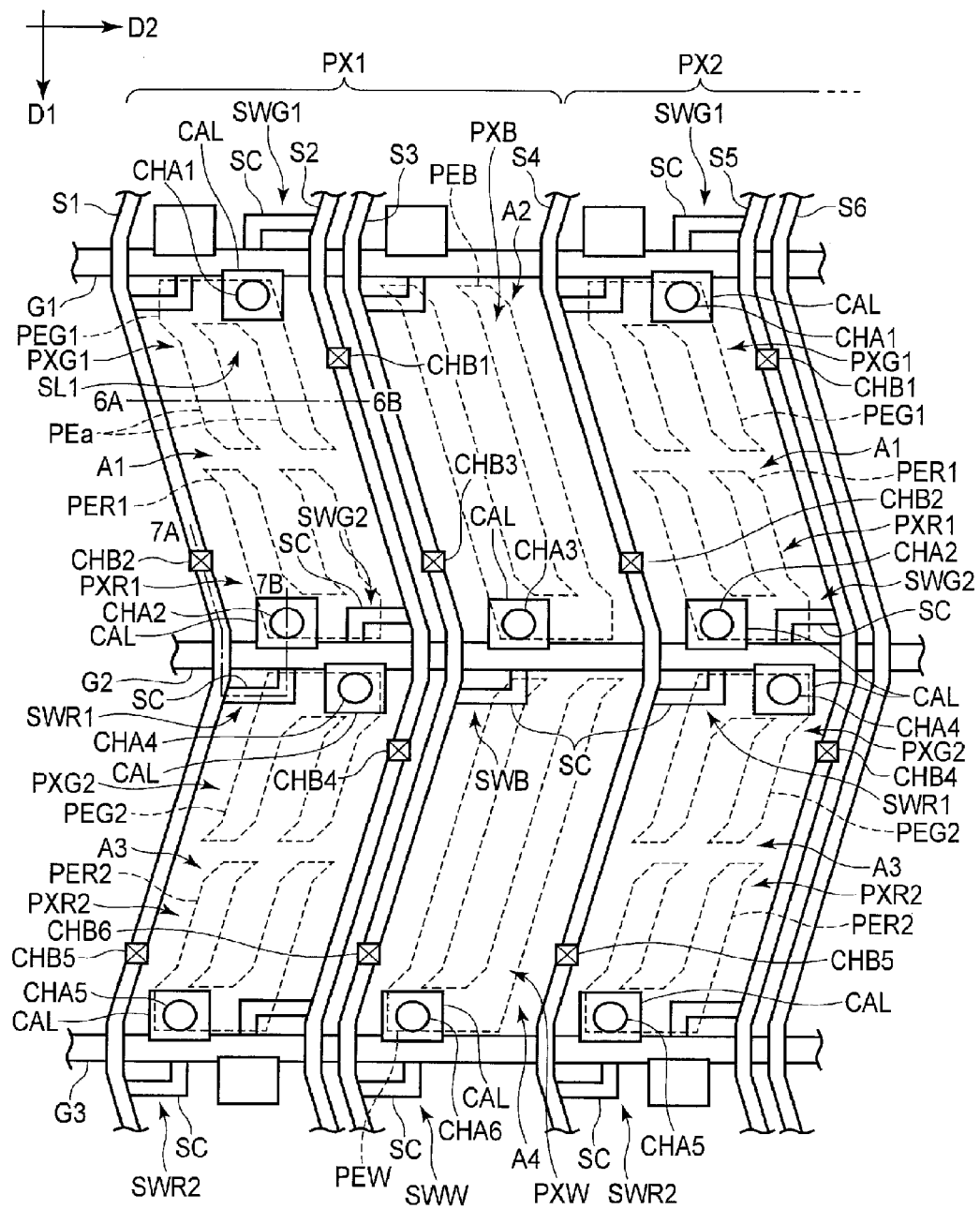
F I G. 5

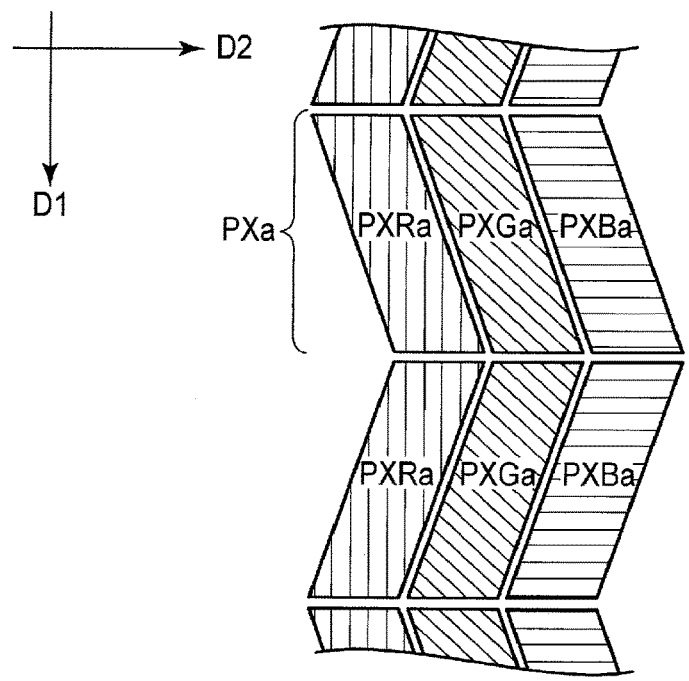
F I G. 11
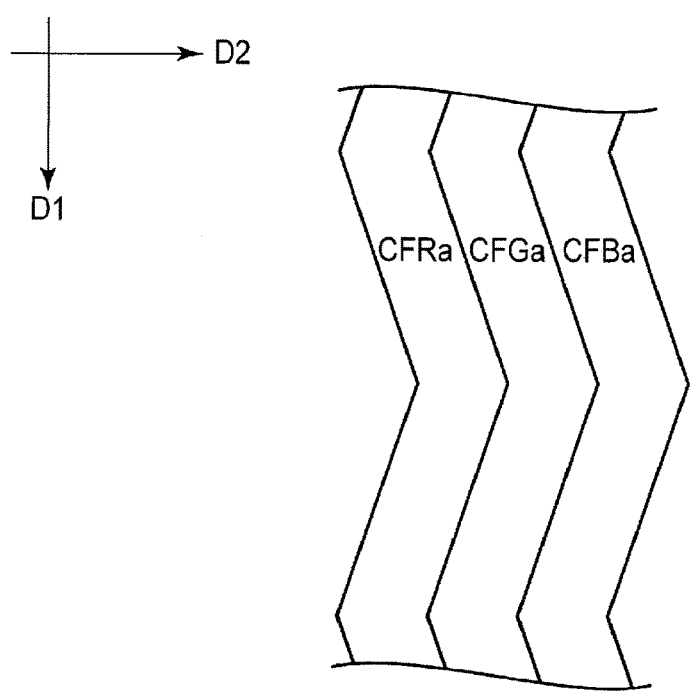
F I G. 12

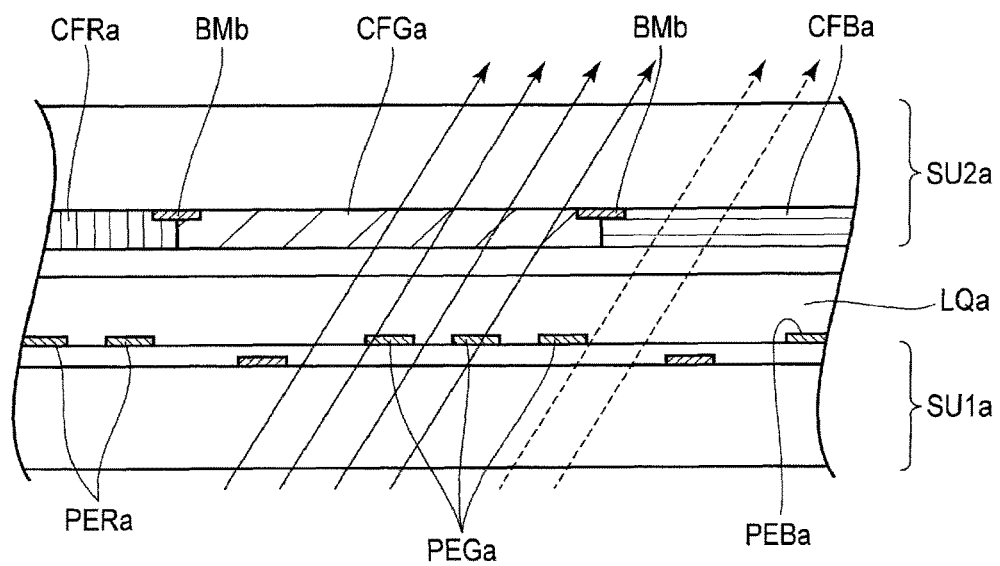
F I G. 14
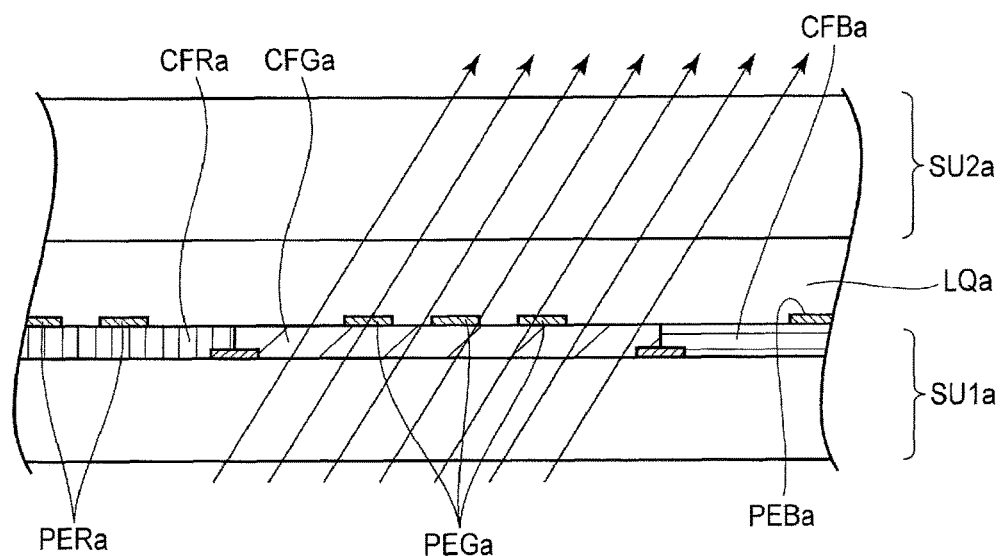
F I G. 15

COLOR FILTER SUBSTRATE AND DISPLAY DEVICE

CROSS-REFERENCE TO RELATED APPLICATIONS

This application is based upon and claims the benefit of priority from Japanese Patent Application No. 2014-255009, filed Dec. 17, 2014, the entire contents of which are incorporated herein by reference.

FIELD

Embodiments described herein relate generally to a color filter substrate and a display device.

BACKGROUND

Display devices such as liquid crystal display devices comprise a pair of substrates opposed to each other wherein switching elements and pixel electrodes are formed on one substrate and color filters are formed on the other substrate. Such a structure is becoming common.

However, in such a display device, if the substrates are misaligned in a layering process, the positional relationship between the pixel electrodes and the color filters is shifted. Thereby, a mixture of colors may occur in adjacent pixels, and nontransparent elements such as interconnects and light-shielding layers that originally should overlap in a plan view may be shifted and the aperture ratio may be decreased.

Furthermore, in recent years, display devices with higher definition have been demanded. Display devices with higher definition require narrower pixels; however, as the pixels become narrower, misalignment of the pixel electrodes and the color filters may occur more and further affect the display quality.

BRIEF DESCRIPTION OF THE DRAWINGS

FIG. 1 schematically shows an example of an exterior of a liquid crystal display device of a first embodiment.

FIG. 2 schematically shows a first substrate of a display panel of the liquid crystal display device.

FIG. 3 shows an example of pixel arrangement in a display area of the display panel.

FIG. 4 shows an example of schematic equivalent circuit of the display panel.

FIG. 5 is a plan view which shows an example of the structure applicable to pixels arranged in the display area.

FIG. 11 shows a comparative example of the first embodiment.

FIG. 12 shows color filters arranged on pixels of FIG. 11.

FIG. 14 shows high definition pixels in which a pixel width is smaller than that of the example of FIG. 13.

FIG. 15 is a cross-sectional view of a display panel of a COA scheme in which pixel electrodes and color filters are disposed on the same substrate.

DETAILED DESCRIPTION

Figure 6:
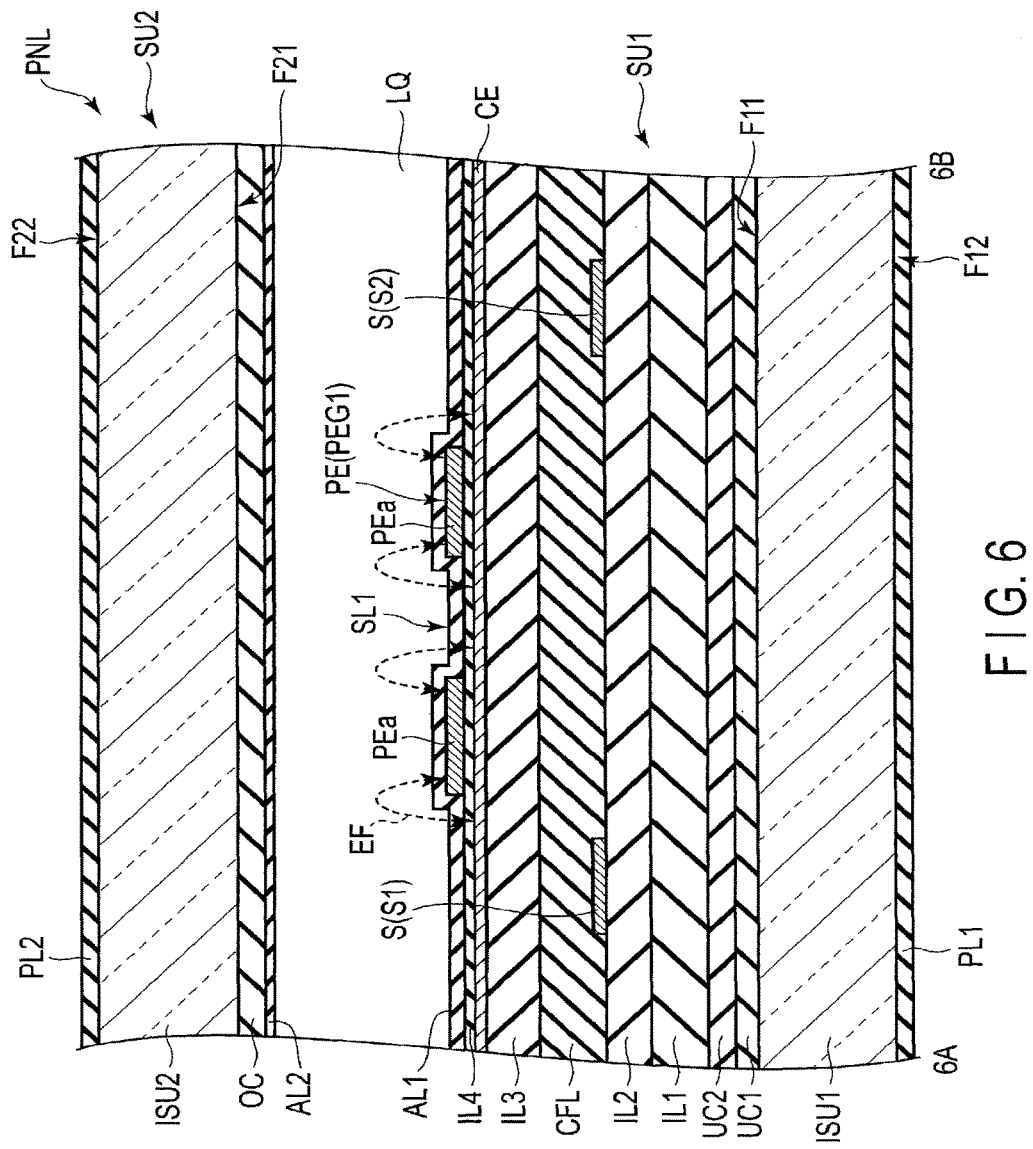
FIG. 6 is a cross-sectional view which schematically shows the display panel taken along line 6A-6B of FIG. 5.

In general, according to one embodiment, provided are a color filter substrate including: an insulating substrate; a first switching element, a second switching element, and a third switching element formed in the pixel area; a first pixel electrode electrically connected to the first switching element in the pixel area; a second pixel electrode electrically connected to the second switching element in the pixel area; a third pixel electrode electrically connected to the third switching element in the pixel area; a first color filter of a first color disposed between the first pixel electrode and the insulating substrate; a second color filter of a second color which is different from the first color, the second color filter disposed between the second pixel electrode and the insulating substrate; and a third color filter of a third color which is different from the first color and the second color, the third color filter disposed between the third pixel electrode and the insulating substrate, wherein the first pixel electrode, the second pixel electrode, and the third pixel electrode are adjacent to each other, the first color filter has a first end, the second color filter has a second end, and the third color filter has a third end, and two of the first end, the second end, and the third end overlap in a first overlap area, and a display device including the color filter substrate.

According to an embodiment, provided are a color filter substrate including: an insulating substrate; a first switching element, a second switching element, and a fourth switching element formed in the pixel area; a first pixel electrode electrically connected to the first switching element in the pixel area; a second pixel electrode electrically connected to the second switching element in the pixel area; a fourth pixel electrode electrically connected to the fourth switching element in the pixel area; a first color filter of a first color disposed between the first pixel electrode and the insulating substrate; a second color filter of a second color which is different from the first color, the second color filter disposed between the second pixel electrode and the insulating substrate; and a fourth color filter which is substantially transparent, the fourth color filter disposed between the fourth pixel electrode and the insulating substrate, wherein the first pixel electrode, the second pixel electrode, and the fourth pixel electrode are adjacent to each other, and at least two color filters of colors having different transmissivity peaks in the visible radiation overlap in a first border area between the first pixel electrode and the fourth pixel electrode and in a second border area between the second pixel electrode and the fourth pixel electrode, and a display device including the color filter substrate.

Hereinafter, the embodiment will be described with reference to the accompanying drawings.

Note that the disclosure is presented for the sake of exemplification, and any modification and variation conceived within the scope and spirit of the invention by a person having ordinary skill in the art are naturally encompassed in the scope of invention of the present application. Furthermore, the width, thickness, shape, and the like of each element are depicted schematically in the Figures as compared to actual embodiments for the sake of simpler explanation, and they are not to limit the interpretation of the invention of the present application. Furthermore, in the description and figures of the present application, structural elements having the same or similar functions will be referred to by the same reference numbers and detailed explanations of them that are considered redundant may be omitted.

In the embodiments, a liquid crystal display device with a detection function is disclosed as an example of the display device. For example, the liquid crystal display device can be used in various devices such as smartphones, tablet computers, feature phones, notebook computers, TVs, in-car devices, and game consoles. Note that the main structures disclosed in the embodiments are applicable to various display devices such as a self-luminous display device with organic electroluminescent display elements and the like, an electronic paper display device with electrophoretic elements and the like, a display device utilizing micro-electro-mechanical systems (MEMS), and an electrochromic display device.

First Embodiment

The first embodiment will be explained. FIG. 1 schematically shows an example of an exterior of a liquid crystal display device DSP of the first embodiment. The liquid crystal display device DSP includes a display panel PNL and a backlight unit BL.

The display panel PNL includes a first substrate SU1, second substrate SU2, and liquid crystal layer (described later in the section related to liquid crystal layer LQ) held between the first substrate SU1 and the second substrate SU2. Furthermore, the display panel PNL includes a display area DA for image display. In the example of FIG. 1, the display area DA is a rectangle having long sides along a first direction D1 and short sides along a second direction D2 orthogonal to the first direction D1. However, the shape of the display area DA is not limited to a rectangle, and may be any other polygon or circle.

The first substrate SU1 includes a connector CN with an external connection terminal. The connector CN is connected to a signal supplier such as a flexible circuit board and IC chip. The flexible circuit board electrically connects the display panel PNL and an external module such as a control board of an electronic device.

The backlight unit BL is positioned at the rear surface side of the first substrate SU1 (at the opposite surface of the surface facing the second substrate SU2) to face the display area DA. The backlight BL can be realized in various ways. For example, the backlight BL may include a light guide plate opposed to the first substrate SU1, a light source including a plurality of light emitting diodes (LED) arranged along the edges of the light guide plate, a reflective sheet disposed on one side of the main surfaces of the light guide plate, and various optical sheets layered on the other side of the main surfaces of the light guide plate.

FIG. 2 schematically shows the surface of the first substrate SU1 facing the second substrate SU2. The first substrate SU1 includes the connector CN and drive circuits PC1, PC2, and PC3 on a peripheral area which does not overlap the display area DA. In the example of FIG. 2, drive circuits PC1 and PC2 are arranged along the long sides of the display area DA, and drive circuit PC3 is arranged along a short side of the display area DA.

A large number of pixels are formed in the display area DA. FIG. 3 shows an example of pixel arrangement. Note that a pixel is a minimum unit for color image display in the display area DA. In the figure, two kinds of pixels PX (PX1 and PX2) are shown. Both pixels PX1 and PX2 include a subpixel PXG1 corresponding to a first color, subpixel PXR1 corresponding to a second color, subpixel PXB corresponding to a third color, subpixel PXG2 corresponding to a fourth color, subpixel PXR2 corresponding to a fifth color, and subpixel PXW corresponding to a sixth color. In the first embodiment, a case where the first and fourth colors are green, the second and fifth colors are red, the third color is blue, and the sixth color is white or substantially transparent is given. Pixels PX1 and PX2 may include subpixels corresponding to colors other than green, red, blue, and white or may be composed of subpixels corresponding to three colors of green, red, and blue excluding white subpixel. Furthermore, in the display area DA, only one kind of pixel PX (that is, pixels PX1 or pixels PX2) may be arranged or three or more kinds of pixels PX (that is, pixels with a different structure in addition to pixels PX1 and PX2) may be arranged.

In the present embodiment, the light having a wavelength range of 380 to 780 nm is defined as visible radiation. A color having its transmissivity peak within a first wavelength range of 380 or more but less than 490 nm is defined as blue. A color having its transmissivity peak within a second wavelength range of 490 or more but less than 590 nm is defined as green. A color having its transmissivity peak within a third wavelength range of 590 or more but less than 780 nm is defined as red. A case where no coloring is performed, and a case where palely coloring of any color of visible radiation is performed are defined as substantially transparent.

Pixels PX1 are arranged in series along the first direction D1. Similarly, pixels PX2 are arranged in series along the first direction D1. The line of pixels PX1 along the first direction D1 and the line of pixels PX2 along the first direction D1 are arranged alternately along the second direction D2.

In pixels PX1 and PX2, subpixels PXG1 and PXR1 are adjacent in the first direction D1, and similarly, subpixels PXG2 and PXR2 are adjacent in the first direction D1, and subpixels PXR1 and PXG2 are adjacent in the first direction D1. In pixel PX1, subpixels PXG1 and PXR1 are adjacent to subpixel PXB in the second direction D2, and subpixels PXG2 and PXR2 are adjacent to subpixel PXW in the second direction D2. On the other hand, in pixel PX2, subpixels PXG1 and PXR1 are adjacent to subpixel PXW in the second direction D2 and subpixel PXG2 and PXR2 are adjacent to subpixel PXB in the second direction D2. Furthermore, in pixel PX1, subpixel PXB is adjacent to subpixels PXG1 and PXR1 of pixel PX2 in the second direction D2. Furthermore, in pixel PX1, subpixel PXW is adjacent to subpixels PXG2 and PXR2 of pixel PX2 in the second direction D2.

In the example of FIG. 3, subpixels PXG1, PXG2, PXR1, and PXR2 have a first area in pixels PX1 and PPX2, and subpixels PXB and PXW have a second area which is larger than the first area. For example, the second area is twice the first area.

The shape of subpixels PXG1, PXG2, PXR1, PXR2, PXB, and PXW is not limited particularly; however, a rectangle or a similar shape (in other words, a substantial rectangle) is suitable, and a parallelogram or a similar shape (in other words, a substantial parallelogram) is more suitable in consideration of visibility and tight pixel arrangement. Furthermore, the width of subpixels PXG1, PXG2, PXR1, PXR2, PXB, and PXW in the second direction D2 is substantially the same (for example, the ratio of lengths of the subpixels is maintained within a range of 0.8 to 1.2 times). Furthermore, the width of subpixels PXB and PXW in the first direction D1 is greater than the width of subpixels PXG1, PXG2, PXR1, and PXR2 in the first direction D1, and specifically it is twice in the example of FIG. 3.

In the retina of the human eye, the number of blue cones is greater than the number of green and red cones. That is, the eye is less sensitive to blue than to green and red. Pixels PX1 and PX2 in FIG. 3 cater to such characteristics of the eye. That is, the size of blue subpixel PXB and the size of white subpixel PXW which is generally bluish are set larger than the size of red subpixels PXR1 and PXR2, and the size of green subpixels PXG1 and PXG2, and the number of blue and white subpixels PXB and PXW is less than the number of the green and red subpixels PXG1, PXG2, PXR1, and PXR2. Consequently, the area of pixels PX1 and PX2 can be increased without practically lowering the resolving power.

Note that, in pixels PX1 and PX2, subpixel PXB and subpixel PXW may have different sizes. Furthermore, subpixels PXG1, PXG2, PXR1, and PXR2 may have different sizes.

FIG. 4 schematically shows an example of an equivalent circuit of the display panel PNL. The display panel PNL includes first signal lines arranged along the first direction D1 to which first signals are supplied and second signal lines arranged along the second direction D2 to which second signals are supplied. First and second signals are used to activate the pixels for image display, and in general, one is gate signals (scan signals) and the other is source signals (image signals). In FIG. 4, a plurality of gate lines G as first signal lines and a plurality of source lines S as second signal lines are shown. For example, counting from any end of the first direction D1, each even-numbered gate line G is connected to a drive circuit PC1 and each odd-numbered gate line G is connected to a drive circuit PC2. Each source line S is connected to a drive circuit PC3.

Gate lines G are grouped as a signal line group A, and source lines S are grouped as a signal line group B. The pixel area in which the above subpixels are formed is composed of crossing signal line groups A and B.

FIG. 4 shows an equivalent circuit of pixel PX1. In pixel PX1, subpixel PXG1 includes switching element SWG1 electrically connected to gate line G1 and source line S2, and pixel electrode PEG1 electrically connected to switching element SWG1. Subpixel PXR1 includes switching element SWR1 electrically connected to gate line G2 and source line S1, and pixel electrode PER1 electrically connected to switching element SWR1. Subpixel PXG2 includes switching element SWG2 electrically connected to gate line G2 and source line S2, and pixel electrode PEG2 electrically connected to switching element SWG2. Subpixel PXR2 includes switching element SWR2 electrically connected to gate line G3 and source line S1, and pixel electrode PER2 electrically connected to switching element SWR2. Subpixel PXB includes switching element SWB electrically connected to gate line G2 and source line S3, and pixel electrode PEB electrically connected to switching element SWB. Subpixel PXW includes switching element SWW electrically connected to gate line G3 and source line S3, and pixel electrode PEW electrically connected to switching element SWW. However, the connection of the switching elements SW (SWG1, SWG2, SWR1, SWR2, SWB, and SWW) of subpixels, gate lines G, and source lines S is not limited to the example of FIG. 4. Note that the switching element is an element that switches electrical characteristics of a resistance or the like and is typically a transistor such as a field-effect transistor (in the example of FIG. 4, field-effect transistors are adopted).

For example, each pixel electrode PE (PEG1, PEG2, PER1, PER2, PEB, and PEW) faces a common electrode CE. The common electrode CE is provided with, for example, a plurality of pixels PX and is electrically connected to a voltage supplier VS which supplies a common voltage.

Drive circuits PC1 and PC2 supply scan signals sequentially with respect to each gate line G. Drive circuit PC3 supplies image signals selectively with respect to each source line S. When both the scan signals and the image signals are input to switching elements SW, a field is produced between the pixel electrodes PE and the common electrodes CE connected to the switching element SW, and the alignment of liquid crystal molecules of the liquid crystal layer LQ held between the first substrate SU1 and the second substrate SU2 can be changed by the field.

An equivalent circuit of pixel PX2 is the same as that of pixel PX1 except that the position of subpixels PXB is switched with the position of subpixels PXW.

The liquid crystal display device DSP structured as above is a transmissive liquid crystal display device which displays images on the display area DA by selectively passing light from the backlight BL through the display panel PNL pixel by pixel. However, the liquid crystal display device DSP may be a reflective liquid crystal display device which displays images by selectively passing external light incident on the second substrate SU2 pixel by pixel, or a transflective liquid crystal display device having both functions of the transmissive display device and the reflective display device.

FIG. 5 is a plan view which shows an example of the structure applicable to pixels PX1 and PX2. FIG. 5 shows subpixels PXG1, PXG2, PXR1, PXR2, PXB, and PXW in pixel PX1 and subpixels PXG1, PXG2, PXR1, and PXR2 in pixel PX2 adjacent to pixel PX1.

In the example of FIG. 5, three gate lines G (G1, G2, and G3) and six source lines S (S1, S2, S3, S4, S5, and S6) are shown. Gate lines G1, G2, and G3 extend linearly along the second direction D2 and arranged at regular intervals along the first direction D1. Source lines S1, S2, S3, S4, S5, and S6 extend linearly and parallel to each other inclining counterclockwise in the first direction D1 at an acute angle between the gate line G1 and gate line G2 and inclining clockwise in the first direction D1 at an obtuse angle between the gate line G2 and the gate line G3. Source lines S1, S2, S3, S4, S5, and S6 are arranged in the second direction D2. Furthermore, source line S2 and source line S3, and source line 5 and source line S6 are adjacent to each other in the second direction D2 without a subpixel interposed therebetween. On the other hand, source line S1 and source line S2, source line S3 and source line S4 are adjacent to each other in the second direction D2 with a subpixel interposed therebetween.

In pixel PX1, pixel electrode PEG1 of subpixel PXG1 and pixel electrode PER1 of subpixel PXR1 are disposed in an area A1 surrounded by gate lines G1 and G2 and source lines S1 and S2. In pixel PX1, pixel electrode PEB of subpixel PXB is disposed in an area A2 surrounded by gate lines G1 and G2 and source lines S3 and S4. In pixel PX1, pixel electrode PEG2 of subpixel PXG2 and pixel electrode PER2 of subpixel PXR2 are disposed in an area A3 surrounded by gate lines G2 and G3 and source lines S1 and S2. In pixel PX1, pixel electrode PEW of subpixel PXW is disposed in an area A4 surrounded by the gate lines G2 and G3 and source lines S3 and S4. Area A1 and area A2 are adjacent to each other in the second direction D2, area A1 and area A3 are adjacent to each other in the first direction D1, area A2 and area A4 are adjacent to each other in the first direction D1, area A3 and area A4 are adjacent to each other in the second direction D2.

The pixel area composed of crossing signal line group A including gate lines G (G1, G2, and G3) and signal line group B including source lines S (S1, S2, S3, and S4) includes areas A1 to A4.

Furthermore, pixel electrodes PEG1 and PER1 are adjacent to each other in the first direction D1, pixel electrodes PEG1 and PER1 are adjacent to pixel electrode PEB in the second direction D2, pixel electrodes PEG2 and PER2 are adjacent to each other in the firsts direction D1, and pixel electrodes PEG2 and PER2 are adjacent to pixel electrode PEW in the second direction D2. Pixel electrodes PER1 and PEG2 are adjacent to each other in the first direction D1, and pixel electrodes PEB and PEW are adjacent to each other in the first direction D1.

Note that, alternatively, area A1 may be defined as an area surrounded by gate lines G1 and G2 and source lines S1 and S3, area A2 may be defined as an area surrounded by gate lines G1 and G2 and source lines S2 and S4, area A3 may be defined as an area surrounded by gate lines G2 and G3 and source lines S1 and S3, and area A4 may be defined as an area surrounded by gate lines G2 and G3 and source lines S2 and S4.

In area A1, pixel electrode PEG1 is disposed at the gate line G1 side (in the proximity of gate line G1), and pixel electrode PER1 is disposed at the gate line G2 side (in the proximity of gate line G2). In area A3, pixel electrode PEG2 is disposed at the gate line G2 side (in the proximity of gate line G2) and pixel electrode PER2 is disposed at the gate line G3 side (in the proximity of gate line G3).

Pixel electrodes PEG1, PEG2, PER1, PER2, PEB, and PEW are disposed in areas A1 to A4 of pixel PX2 in a similar manner to pixel PX1. Details are substantially the same as that of pixel PX1 and are thus omitted.

In the example of FIG. 5, each of pixel electrodes PEG1, PEG2, PER1, PER2, PEB, and PEW has a slit SL1 and two comb electrodes PEa formed as bending belts with the slit SL1 interposed therebetween. Comb electrodes PEa extend to incline with respect to either the first direction D1 or the second direction D2 as a whole. Note that the pixel electrode may be a single electrode extending in a single direction.

Each of switching elements SWG1, SWG2, SWR1, SWR2, SWB, and SWW includes a semiconductor layer SC.

In pixel PX1, the semiconductor layer SC of switching element SWG1 is electrically connected to pixel electrode PEG1 at one end through a connection electrode CAL and connection hole CHA1 and is electrically connected to source line S2 at the other end through a connection hole CHB1.

The semiconductor layer SC of switching element SWR1 is similar to the above semiconductor layer SC of switching element SWG1. In this case, CHA1 is CHA2, CHB1 is CHB2, PEG1 is PER1, and source line S2 is source line S1.

The semiconductor layer SC of switching element SWB is similar to the above semiconductor layer SC of switching element SWG1. In this case, CHA1 is CHA3, CHB1 is CHB3, pixel electrode PEG1 is pixel electrode PEB, and source line S2 is source line S3.

The semiconductor layer SC of switching element SWG2 is similar to the above semiconductor layer SC of switching element SWG1. In this case, CHA1 is CHA4, CHB1 is CHB4, and pixel electrode PEG1 is pixel electrode PEG2.

The semiconductor layer SC of switching element SWR2 is similar to the above semiconductor layer SC of switching element SWG1. In this case, CHA1 is CHA5, CHB1 is CHB5, pixel electrode PEG1 is pixel electrode PER2, and source line S2 is source line S1.

The semiconductor layer SC of switching element SWW is similar to the above semiconductor layer SC of switching element SWG1. In this case, CHA1 is CHA6, CHB1 is CHB6, pixel electrode PEG1 is pixel electrode PEW, and source line S2 is source line S3.

Furthermore, in each corresponding area, connection hole CHA1 is formed at the gate line G1 side (in the proximity of gate line G1), connection holes CHA2, CHA3, and CHA4 are formed at the gate line G2 side (in the proximity of gate line G2), and connection holes CHA5 and CHA6 are formed at the gate line G3 side (in the proximity of gate line G3).

Furthermore, between gate lines G1 and G2, connection hole CHB1 is formed to overlap source line S2, connection hole CHB2 is formed to overlap source line S1, and connection hole CHB3 is formed to overlap source line S3. On the other hand, between gate lines G2 and G3, connection hole CHB4 is formed to overlap source line S2, connection hole CHB5 is formed to overlap source line S1, and connection hole CHB6 is formed to overlap source line S3.

The structure of pixel PX2 is substantially the same as that of pixel PX1 and its explanation is thus omitted.

FIG. 6 is a schematic cross-sectional view which shows the display panel PNL taken along line 6A-6B of FIG. 5. The first substrate SU1 includes a first insulating substrate ISU1 such as a glass substrate or a resin substrate. The first insulating substrate ISU1 has a first surface F11 which is opposed to the second substrate SU2 and is covered with a first undercoat layer UC1. The first undercoat layer UC1 is covered with a second undercoat layer UC2. The first undercoat layer UC1 and the second undercoat layer UC2 are formed of a material such as silicon oxide (SiO) or silicon oxynitride (SiON).

The second undercoat layer UC2 is covered with a first insulating layer IL1, and the first insulating layer IL1 is covered with a second insulating layer IL2. The first insulating layer IL1 and the second insulating layer IL2 are formed of a material such as silicon oxide (SiO) or silicon nitride (SiNi).

Source lines S (S1 and S2) are formed on the surface of the second insulating layer IL2 at the liquid crystal layer LQ side. Source lines S are covered with a color filter layer CFL. The color filter layer CFL also covers the second insulating layer IL2. The color filter layer CFL is covered with a third insulating layer IL3. In the example of FIG. 6, the color filter layer is depicted as a single layer; however, the color filter layer CFL includes a plurality of island-shaped color filters as described later with reference to FIG. 8.

The common electrode CE is formed on the surface of the third insulating layer IL3 at the liquid crystal layer LQ side. The common electrode CE is covered with a fourth insulating layer IL4 which is formed of, for example, silicon nitride (SiNx). The pixel electrode PE (PEG1) is formed on the surface of the fourth insulating layer IL4 at the liquid crystal layer LQ side. That is, in the example of FIG. 6, the pixel electrode PE and common electrode CE are opposed to each other with the fourth insulating layer IL4 interposed therebetween. The pixel electrode PE and the fourth insulating layer IL4 are covered with a first alignment film AL1 contacting the liquid crystal layer LQ.

The pixel electrode PE and common electrode CE are formed of a transparent conductive material such as indium tin oxide (ITO).

On the other hand, the second substrate SU2 includes a second insulating substrate ISU2 such as a glass substrate or a resin substrate. The second insulating substrate ISU2 has a first surface F21 which is opposed to the first substrate SU1 and is covered with an overcoat layer OC. In the example depicted, the first surface F21 opposed to source liens S (S1 and S2) and pixel electrode PE is covered with the overcoat layer OC, and a light shielding layer BM (described later) is not formed to be opposed to source lines S. The overcoat layer OC is covered with a second alignment film AL2 contacting the liquid crystal layer LQ.

The first alignment film AL1 and the second alignment film AL2 are used for the alignment of liquid crystal molecules in the liquid crystal layer LQ. The first alignment film AL1 and the second alignment film AL2 are formed of a material such as polyimide organic high polymers. The first alignment film AL1 and the second alignment film AL2 are subjected to an alignment treatment by a rubbing process, or a photoalignment process by irradiating polarized ultraviolet ray thereon. If the photoalignment process is performed, the influence of the asperity of the surfaces of the first alignment film AL1 and the second alignment film AL2 on the alignment treatment can be blocked or reduced.

The liquid crystal layer LQ has a positive dielectric constant anisotropy in which a dielectric constant in an alignment direction is larger than a vertical direction of the alignment direction, has a high resistance, and shows a nematic phase within a wide temperature range including a room temperature. Here, an alignment treatment is performed with respect to the first alignment film AL1 and the second alignment film AL2 such that the alignment state (initial alignment state) of liquid crystal molecules in the liquid crystal layer LQ conforms to the first direction D1 while no voltage is applied to the liquid crystal layer LQ. The initial alignment state of the liquid crystal molecules is, for example, a homogeneous alignment state.

By applying a voltage between the pixel electrode PE and common electrode CE, a fringe field EF including components parallel to the main surfaces of the substrates (flat surfaces parallel to the first direction D1 and the second direction D2) is produced. The liquid crystal molecules of the liquid crystal layer LQ rotate in parallel to the main surfaces of the substrates. Note that, in the present embodiment, the pixel electrode PE and common electrode CE are arranged such that a fringe field EF which is a kind of transverse field schemes is produced therein; however, no limitation is intended thereby. Vertical field schemes and oblique field schemes are applicable to the embodiments of the present application and the arrangement of the pixel electrode PE and common electrode CE should be arbitrarily determined to correspond to a desired field.

FIG. 6 is a cross-sectional view of the display panel PNL focusing on subpixel PXG1; however, the same structure and function are applicable to the other subpixels PXG2, PXR1, PXR2, PXB, and PXW with pixel electrodes PEG2, PER1, PER2, PEB, and PEW.

Figure 7:
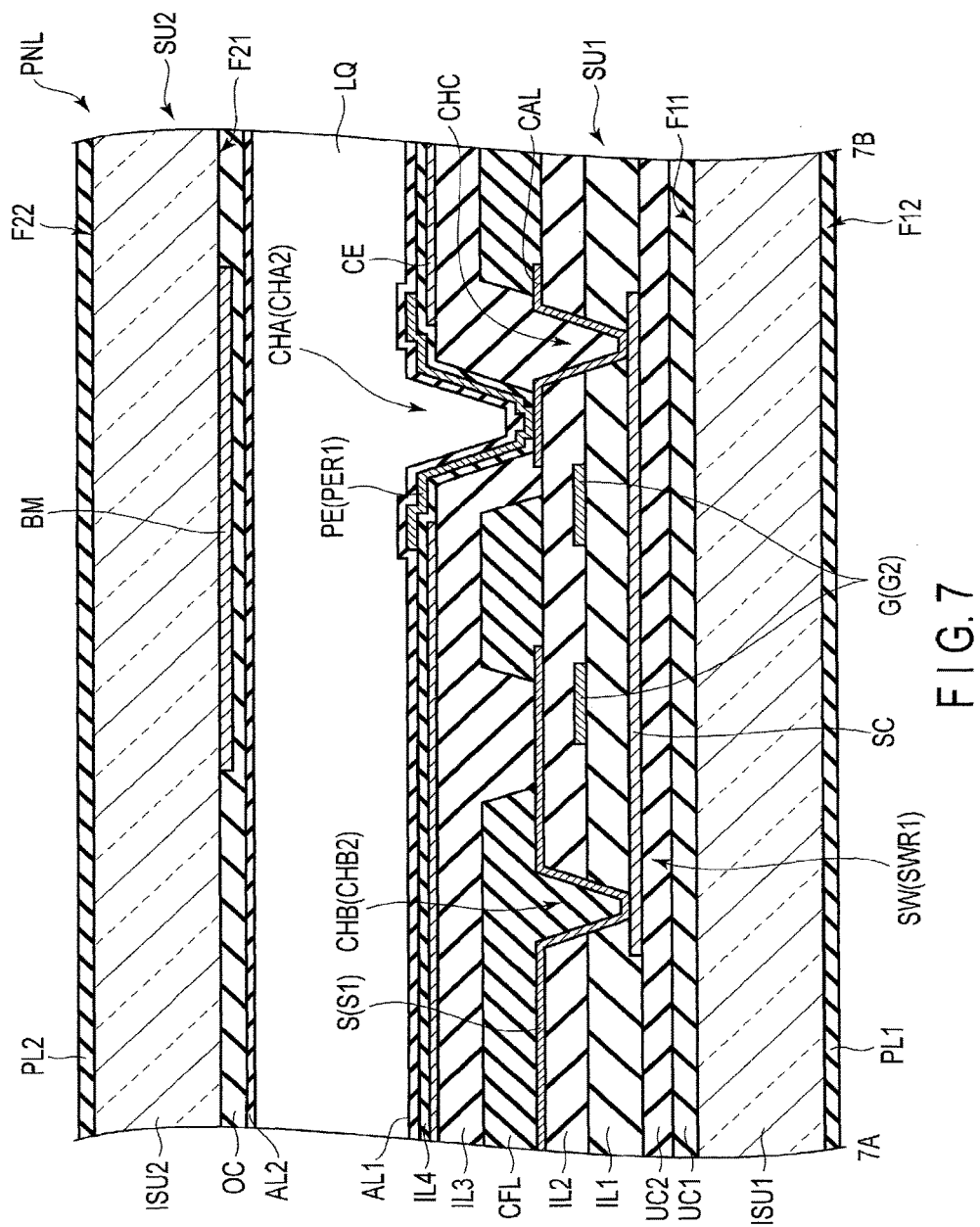
FIG. 7 is a cross-sectional view which schematically shows the display panel taken along line 7A-7B of FIG. 5.

FIG. 7 is a schematic cross-sectional view of the display panel PNL taken along line 7A-7B of FIG. 5. The semiconductor layer SC of the switching element SW (SWR1) is formed on the surface of the second undercoat layer UC2 at the liquid crystal layer LQ side. The semiconductor layer SC is formed of a material such as polysilicon. A light-shielding layer opposed to the semiconductor layer SC may be provided between the first insulating substrate ISU1 and the first undercoat layer UC1, or between the first undercoat layer UC1 and the second undercoat layer UC2 to prevent light from the backlight unit BL on the semiconductor layer SC.

In the example of FIG. 7, a connection hole CHB (CHB2) is pierced through the first insulating layer IL1 and the second insulating layer IL2. The source line S (S1) contacts the semiconductor layer SC through connection hole CHB.

A connection hole CHC passes through the first insulating layer IL1 and the second insulating layer IL2. The connection electrode CAL contacts the semiconductor layer SC through the connection hole CHC. The connection electrode CAL and the source line S are formed in the same layer. The connection electrode CAL and the source line S have a three-layer structure including, for example, aluminum or aluminum alloy interposed two titanium layers or titanium alloy layers.

The gate line G (G2) is formed on the surface of the first insulating layer IL1 at the liquid crystal layer LQ side and is covered with the second insulating layer IL2. The gate line G is formed of a material such as molybdenum tungsten (MoW) alloy.

In the examples of FIGS. 5 to 7, a top-gate and double-gate thin-film transistor is shown as an example of the switching element SW; however, the switching element SW is not limited to such a thin-film transistor. For example, the switching element SW may be, for example, a single-gate thin-film transistor or a bottom-gate thin-film transistor.

In the example of FIG. 7, the connection hole CHA (CHA2) is pierced through the color filter layer CFL, third insulting layer IL3, fourth insulating layer IL4, and common electrode CE. The pixel electrode PE (PER1) contacts the connection electrode CAL through a connection hole CHA.

In a cross-sectional view of the connection hole CHA (CHA2 in the example of FIG. 7), the fourth insulating layer IL4 is positioned at the innermost of the connection hole CHA, the third insulating layer IL3 is outside thereof, and the common electrode CE and the edges of the color filter CFL are outside thereof. In the connection hole CHA the fourth insulating layer IL4 is covered with the pixel electrode PE. In the connection hole CHA structured as above in a cross-sectional view, the color filter layer CFL is covered with the pixel electrode PE, fourth insulating layer IL4, and third insulating layer IL3, and thus, even if impurities are contained in the color filter layer CLF, transference of the impurities to the liquid crystal layer LQ can be prevented effectively.

A light-shielding layer BM is formed on the first surface F21 of the second insulating substrate ISU2 to be opposed to the connection hole CHA and the gate line G. The light-shielding layer BM is covered with the overcoat layer OC.

FIG. 7 is a cross-sectional view of the display panel PNL focusing on subpixel PXG1; however, the same structure and function are applicable to the other subpixels PXG2, PXR2, PXB, and PXW with pixel electrodes PEG1, PEG2, PER2, PEB, and PEW, switching elements SWG1, SWG2, SWR2, SWB, and SWW, connection holes CHA1, and CHA3 to CHA6, and connection holes CHB1, and CHB3 to CHB6.

Connections holes CHA1, CHA2, CHA3, CHA4, CHA5, and CHA6 are examples of through-holes formed on the third insulating layer IL3: first aperture, second aperture, third aperture, fourth aperture, fifth aperture, and sixth aperture, respectively.

As shown in FIGS. 6 and 7, in the first embodiment, the color filter layer CFL is provided with the first substrate SU1. That is, the liquid crystal display device DSP is based on a color-filter-on-array (COA) scheme and the first substrate SU1 is a color filter substrate including both the switching element SW and the color filter layer CFL.

Figure 8:
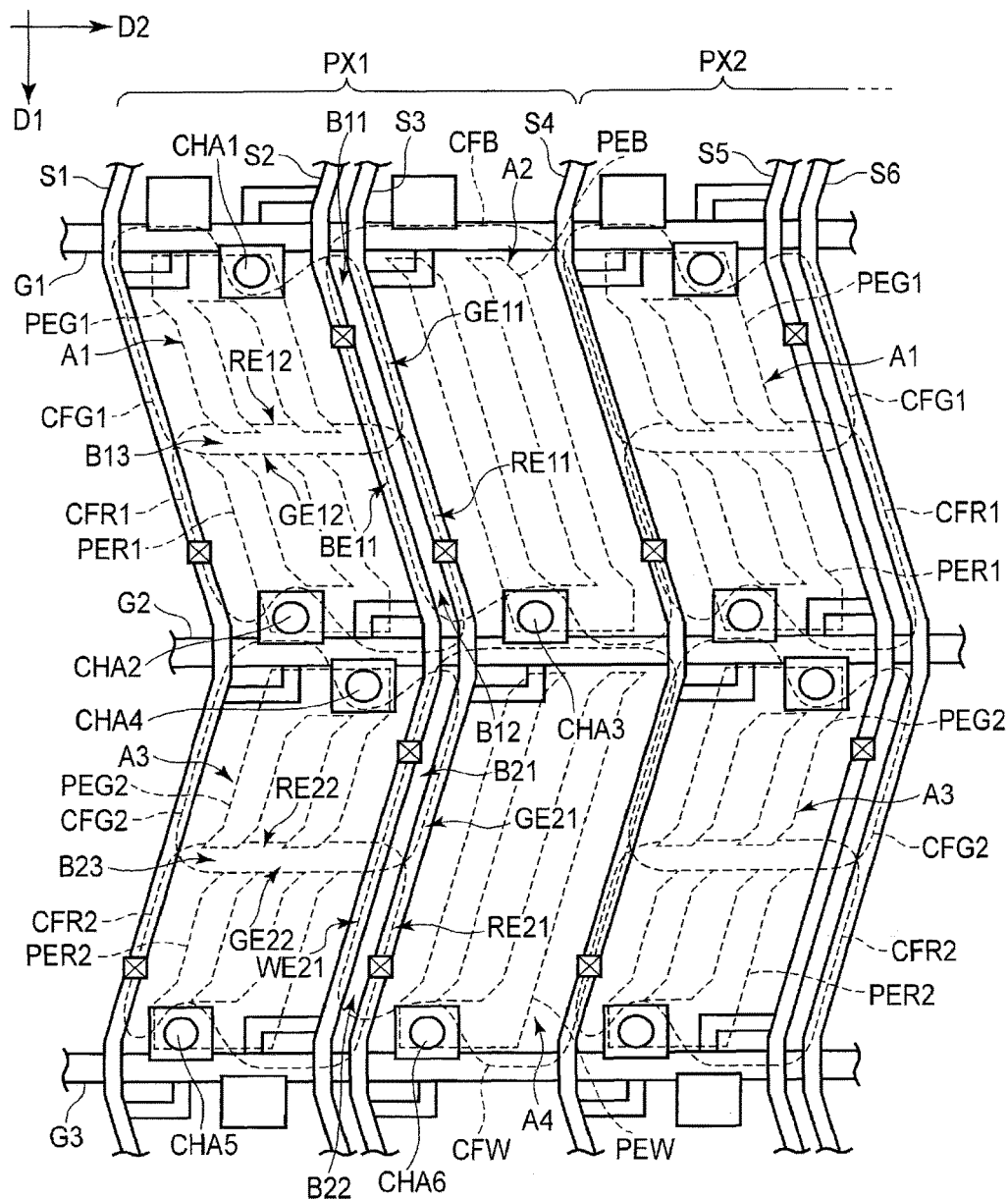
FIG. 8 is a plan view which schematically shows shapes of color filters arranged in the pixels of FIG. 5.

The color filter layer CFL includes a plurality of color filters corresponding to different colors. FIG. 8 is a schematic plan view showing an example of the shape of color filters CF (CFG1, CFG2, CFR1, CFR2, CFB, and CFW) arranged in pixels PX1 and PX2 of FIG. 5.

Color filter CFG1 is opposed to pixel electrode PEG1, color filter CFG2 is opposed to pixel electrode PEG2, color filter CFR1 is opposed to pixel electrode PER1, color filter CFR2 is opposed to pixel electrode PER2, color filter CFB is opposed to pixel electrode PEB, and color filter CFW is opposed to pixel electrode PEW.

Color filters CFG1 and CFG2 are formed of an organic resin material with a green pigment, for example. Color filters CFR1 and CFR2 are formed of an organic resin material with a red pigment, for example. Color filter CFB is formed of an organic resin material with a blue pigment, for example. Color filter CFW is formed of an organic resin material which is substantially colorless. For example, color filters CFG1, CFG2, CFR1, CFR2, CFB, and CFW each have a substantially same thickness in the position to be opposed to the corresponding pixel electrode. However, the thickness of each of color filters CFG1, CFG2, CFR1, CFR2, CFB, and CFW gradually decreases toward the end area thereof. Note that color filter CFW may be omitted in subpixel PXW; however, in that case, flattening of the color filter layer CFL by the third insulating layer IL3 may not be performed sufficiently, and the thickness of the liquid crystal layer LQ increases at subpixel PXW, and the display color of subpixel PXW may become yellowish. That is, color filter CFW keeps the thickness of subpixel PXW the same as that of the other subpixels and prevents the display color thereof from being tinted.

Color filters CFG1 and CFR1 are disposed in area A1. Color filter CFG1 has an end GE11 disposed in a border area B11 between pixel electrodes PEG1 and PEB, and an end GE12 disposed in a border area B13 between pixel electrodes PEG1 and PER1. In pixel PX1, end GE11 is opposed to source lines S2 and S3. An end of color filter CFG1 opposite to end GE11 in the second direction D2 is opposed to source line S1. End GE12 is disposed in the proximity of the center of area A1 (that is, in the proximity of the center between gate line G1 and gate line G2). An end of color filter CFG1 opposite to end GE12 in the first direction D1 is opposed to gate line G1 to avert connection hole CHA1 in part. Color filter CFR1 has an end RE11 disposed in a border area B12 between pixel electrodes PER1 and PEB, and an end RE12 disposed in a border area B13 between pixel electrodes PEG1 and PER1. In pixel PX1, end RE11 is opposed to source lines S2 and S3. An end of color filter CER1 opposed to end RE11 in the second direction D2 is opposed to source line S1. End RE12 is disposed in the proximity of the center of area A1. An end of color filter CFR1 opposite to end RE12 in the first direction D1 is opposed to gate line G2 to avert connection hole CHA2 in part.

Color filter CFB is disposed in area A2. Color filter CFB has an end BE11 disposed in border area B11 and border area B12. In pixel PX1, end BE11 is opposed to source lines S2 and S3. An end of color filter CFB opposite to end BE11 in the second direction D2 is opposed to source line S4. An end of color filter CFB in the first direction D1 is opposed to gate line G1 and the other end thereof is opposed to gate line G2 to avert connection hole CHA3 in part.

Color filters CFG2 and CFR2 are disposed in area A3. Color filter CFG2 has an end GE12 disposed in a border area B21 between pixel electrodes PEG2 and PEW, and an end GE22 disposed in a border area B23 between pixel electrodes PEG2 and PER2. In pixel PX1, end GE21 is opposed to source lines S2 and S3. An end of color filter CFG2 opposite to end GE21 in the second direction D2 is opposed to source line S1. End GE22 is disposed in the proximity of the center of area A3 (that is, in the proximity of the center between gate line G2 and gate line G3). An end of color filter CFG2 opposite to end GE22 in the first direction D1 is opposed to gate line G2 to avert connection hole CHA4 in part. Color filter CFR2 has an end RE21 disposed in a border area B22 between pixel electrodes PER2 and PEW, and an end RE22 disposed in a border area B23 between pixel electrodes PEG2 and PER2. In pixel PX1, end RE21 is opposed to source lines S2 and S3. An end of color filter CER2 opposed to end RE21 in the second direction D2 is opposed to source line S1. End RE22 is disposed in the proximity of the center of area A3. An end of color filter CFR2 opposite to end RE22 in the first direction D1 is opposed to gate line G3 to avert connection hole CHA5 in part.

Color filter CFW is disposed in area A4. Color filter CFW has an end WE21 disposed in border area B21 and border area B22. In pixel PX1, end WE21 is opposed to source lines S2 and S3. An end of color filter CFW opposite to end WE21 in the second direction D2 is opposed to source line S4. An end of color filter CFW in the first direction D1 is opposed to gate line G2 and the other end thereof is opposed to gate line G3 to avert connection hole CHA6 in part.

In pixel PX1, ends GE11, RE11, and BE11 overlap in the position opposed to source lines S2 and S3, and furthermore, ends GE21, RE21, and WE21 overlap in the same position. In the proximity of the center of area A1, ends GE12 and RE12 overlap. In the proximity of the center of area A3, ends GE22 and RE22 overlap.

Color filters CFG1, CFG2, CFR1, and CFR2 are disposed in pixel PX2 in the same manner as pixel PX1, and ends of the color filters overlap in the same manner.

Furthermore, between pixel PX1 and pixel PX2, an end of color filter CFB of pixel PX1 and ends of color filters CFG1 and CFR1 of pixel PX2 overlap in the position opposed to source line S4, and an end of color filter CFW of pixel PX1 and ends of color filters CFG2 and CFR2 of pixel PX2 overlap in the same position.

Furthermore, a distance from the center point of a connection hole CH and ends of color filters CF adjacent with respect to the connection hole CH should be set as even as possible. In the example of FIG. 8, a distance from the center point of connection hole CHA2 to the end of color filter CFR1 should be set as even as possible with a distance from the center point of connection hole CHA2 to the end of color filter CFG2. Thereby, deterioration of image quality caused by a shift in an attachment process of a plurality of substrates can be reduced.

Figure 9A:
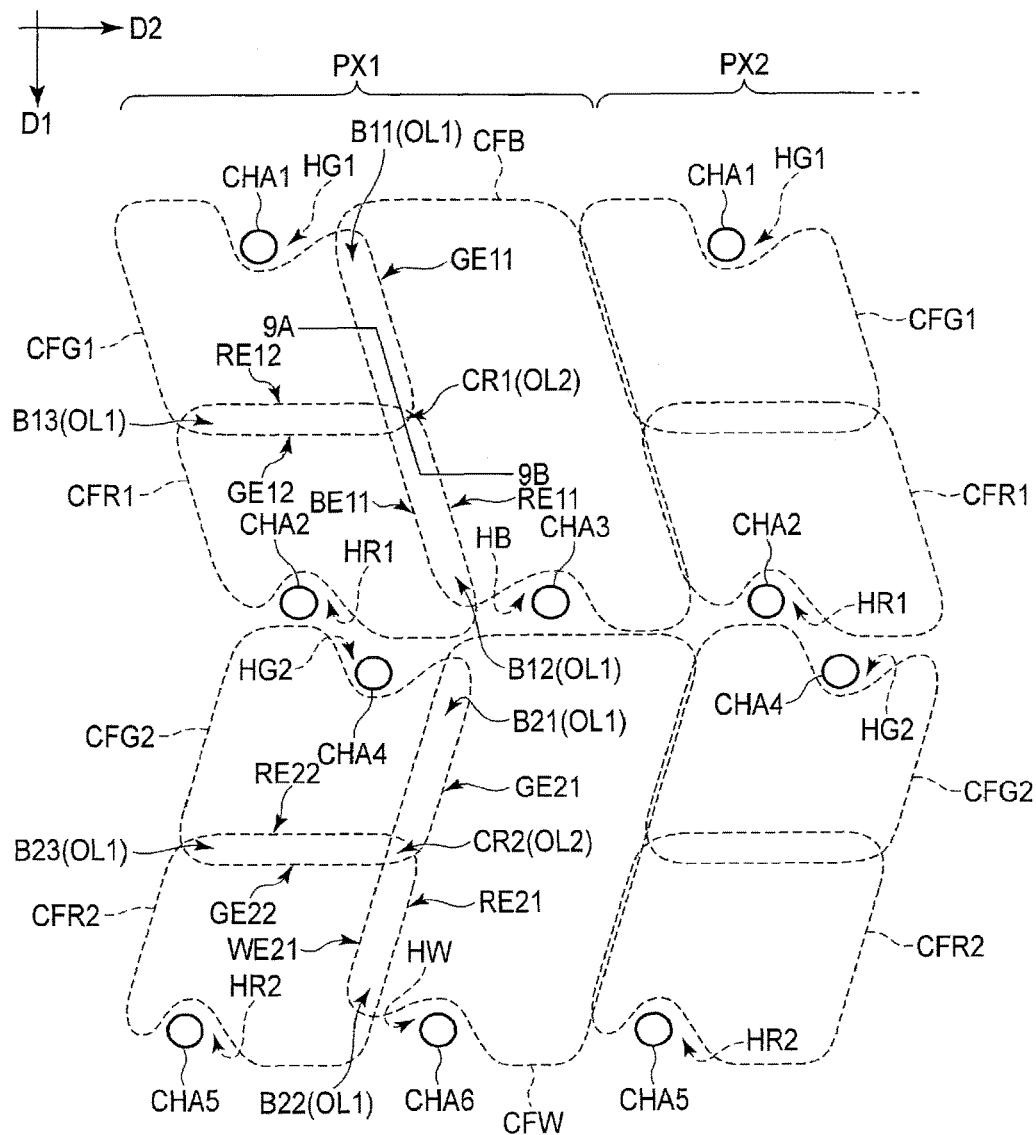
FIG. 9A shows color filters and connection holes of FIG. 8.

FIG. 9A shows color filters CFG1, CFG2, CFR1, CFR2, CFB, and CFW and connection holes CHA1 to CHA6 of FIG. 8. Color filters CFG1, CFG2, CFR1, CFR2, CFB, and CFW are formed as islands and color filters of the same color do not contact. That is, each color filter is surrounded by color filters of different colors.

In the example depicted, the area of each of color filters CFB and CFW is greater than the area of color filter CFG1, the area of color filter CFG2, the area of color filter CFR1, and the area of color filter CFR2. Note that color filters CFB and CFW do not necessarily have the same area. Furthermore, color filters CFG1, CFG2, CFR1, and CFR2 may have different areas.

Color filters CFG1, CFG2, CFR1, CFR2, CFB, and CFW have a parallelogram-like shape with rounded corners. Connection holes CHA1 to CHA6 are disposed not to overlap any of color filters CFG1, CFG2, CFR1, CFR2, CFB, and CFW in a plan view. In the example of FIG. 8, color filter CFG1 has a recess HG1, color filter CFG2 has a recess HG2, color filter CFR1 has a recess HR1, color filter CFR2 has a recess HR2, color filter CFB has a recess HB, and color filter CFW has a recess HW. Connection hole CHA1 is formed in the recess HG1, connection hole CHA2 is formed in the recess HR1, connection hole CHA3 is formed in the recess HB, connection hole CHA4 is formed in the recess HG2, connection hole CHA5 is formed in recess HR2, and connection hole CHA6 is formed in the recess HW.

With respect to color filters CFG1, CFG2, CFR1, CFR2, CFB, and CFW, ends of any adjacent color filters overlap each other. As overlap areas in which color filters overlap, there are an overlap area in which ends of two color filters overlap and an overlap area in which ends of three color filters overlap. In each overlap area, color filters overlapping each other should be of at least two colors having different transmissivity peaks in the visible radiation.

For example, color filters CFG1, CFR1, and CFB are adjacent to each other in pixel PX1. With respect to ends of color filters CFG1, CFR1, and CFB, two ends overlap in a first overlap area OL1. In this example, the first overlap area OL1 is positioned in at least one of border areas B11, B12, and B13. Specifically, ends GE11 and BE11 overlap in border area B11. Ends RE11 and BE11 overlap in border area B12, and ends GE12 and RE12 overlap in border area B13.

Furthermore, with respect to ends of color filters CFG1, CFR1, and CFB, three ends overlap in a second overlap area OL2 which is different from the first overlap area OL1. In this example, the second overlap area OL2 is positioned in a crossing point CR1 where border areas B11, B12, and B13 cross each other. As detailed later, an end of color filter CFG1, an end of color filter CFR1, and an end of color filter CFB overlap each other at the crossing point CR1.

Color filters CFG2, CFR2, and CFW are adjacent to each other.

With respect to ends of color filters CFG2, CFR2, and CFW, two ends overlap in a first overlap area OL1. In this example, the first overlap area OL1 is positioned in at least one of border areas B21, B22, and B23. Specifically, ends GE21 and WE21 overlap in border area B21. Ends RE21 and WE21 overlap in border area B22, and ends GE22 and RE22 overlap in border area B23.

Furthermore, with respect to the ends of color filters CFG2, CFR2, and CFW, three ends overlap in a second overlap area OL2 which is different from the first overlap area OL1. In this example, the second overlap area OL2 is positioned in a crossing point CR2 where border areas B21, B22, and B23 cross each other. As detailed later, an end of color filter CFG2, an end of color filter CFR2, and an end of color filter CFW overlap each other at the crossing point CR2.

Figure 9B:
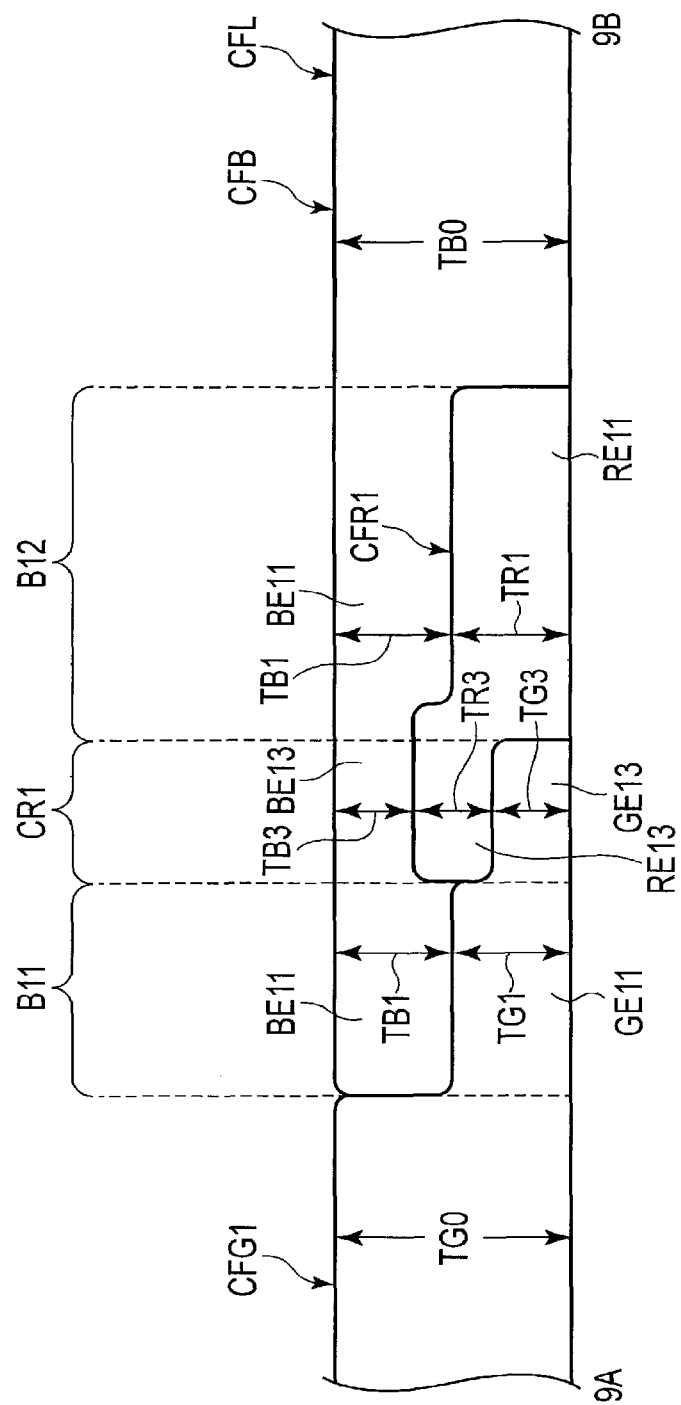
FIG. 9B is a cross-sectional view which schematically shows a color filter layer CFL taken along line 9A-9B of FIG. 9A.

FIG. 9B is a cross-sectional view which schematically shows the color filter layer CFL taken along line 9A-9B of FIG. 9A.

Note that, in the present application, an expression "on" with respect to the color filter layer CFL formed on the first substrate SU1 is a side distancing from the first insulating substrate ISU1 and a side approaching the second substrate SU2 in a cross-sectional view as in FIG. 6 or the like.

Color filter CFG1 has ends GE11 and GE13. Color filter CFR1 has ends RE11 and RE13. Color filter CFB has ends BE11 and BE13. End BE11 is disposed on end GE11 in border area B11. End RE11 is disposed on end BE11 in border area B12. End RE13 is disposed on end GE13, and end BE13 is disposed on end RE13 at the crossing point CR1. That is, end BE11 is positioned to be more distant from the first insulating substrate than are ends GE11 and RE11. Furthermore, end BE13 is positioned to be more distant from the first insulating substrate than are ends GE13 and RE13. Furthermore, end RE13 is positioned to be more distant from the first insulating substrate than is end GE13.

The layered structure as above can be achieved by forming both green filters CFG and red filters CFB before forming blue filters CFB. Each color filter is subjected to a photolithography process for patterning, and then is subjected to a heating process for the formation. A blue filter CFB is easily affected by heat in comparison with color filters of different colors, and color fading or color changing may occur. Therefore, blue filters CFB are formed after the color filters of different colors to reduce the heat affection and to suppress color fading and color changing. Furthermore, the formation order of color filters CFG and CFR should be determined in consideration of treatment characteristics thereof. In this example, color filters CFG are formed before color filters CFR since color filters CFG are less treatable in comparison with color filters CFR. Therefore, color filters CFG are less affected by asperity of an underlying material and are stably formed in a desired shape.

Since border areas B11 and B12 in which two ends overlap and the crossing point CR1 in which three ends overlap are provided in a mixed manner, the thickness of the color filter layer CFL tends to be uneven. Specifically, the crossing point CR1 tends to be thicker than border areas B11 and B12. In the first embodiment, the crossing point CR1 is formed to be substantially the same as border areas B11 and B12. That is, end GE11 has a thickness TG1 and end GE13 has a thickness TG3. Furthermore, end RE11 has a thickness TR1, and end RE13 has a thickness TR3. Furthermore, end BE11 has a thickness TB1 and end BE13 has a thickness TB3. The thicknesses above should satisfy at least one of the following relationships: (A) thickness TG3 is less than thickness TG1; (B) thickness TR3 is less than thickness TR1; and (C) thickness TB3 is less than thickness TB1. In the example depicted, relationships A, B, and C are all satisfied. In this example, a thickness TG0 of the main body of color filter CFG1 (an area opposed to a pixel electrode PEB) is substantially the same as a thickness TB0 of the main body of color filter CFB (an area opposed to a pixel electrode PEB). In border area B11, the sum of thickness TG1 of end GE11 and thickness TB1 of end BE11 is substantially the same as thickness TG0. In border area B12, the sum of thickness TR1 of end RE11 and thickness TB1 of end BE11 is substantially the same as thickness TB0. At the crossing point CR1, the sum of thickness TG3 of end GE13, thickness TR3 of end RE13, and thickness TB3 of end BE13 is substantially the same as thickness TG0. Therefore, in the color filter layer CFL including border areas B11 and B12 and the crossing point CR1, unevenness in the thickness can be reduced. Therefore, the liquid crystal layer in the areas opposed to border areas B11 and B12 and the crossing point CR1 can be even, and a decrease in transmissivity caused by a local decrease in percentage modulation can be suppressed. Note that the phrase substantially the same used here indicates a thickness ratio from 0.7 to 1.3.

Figure 10:
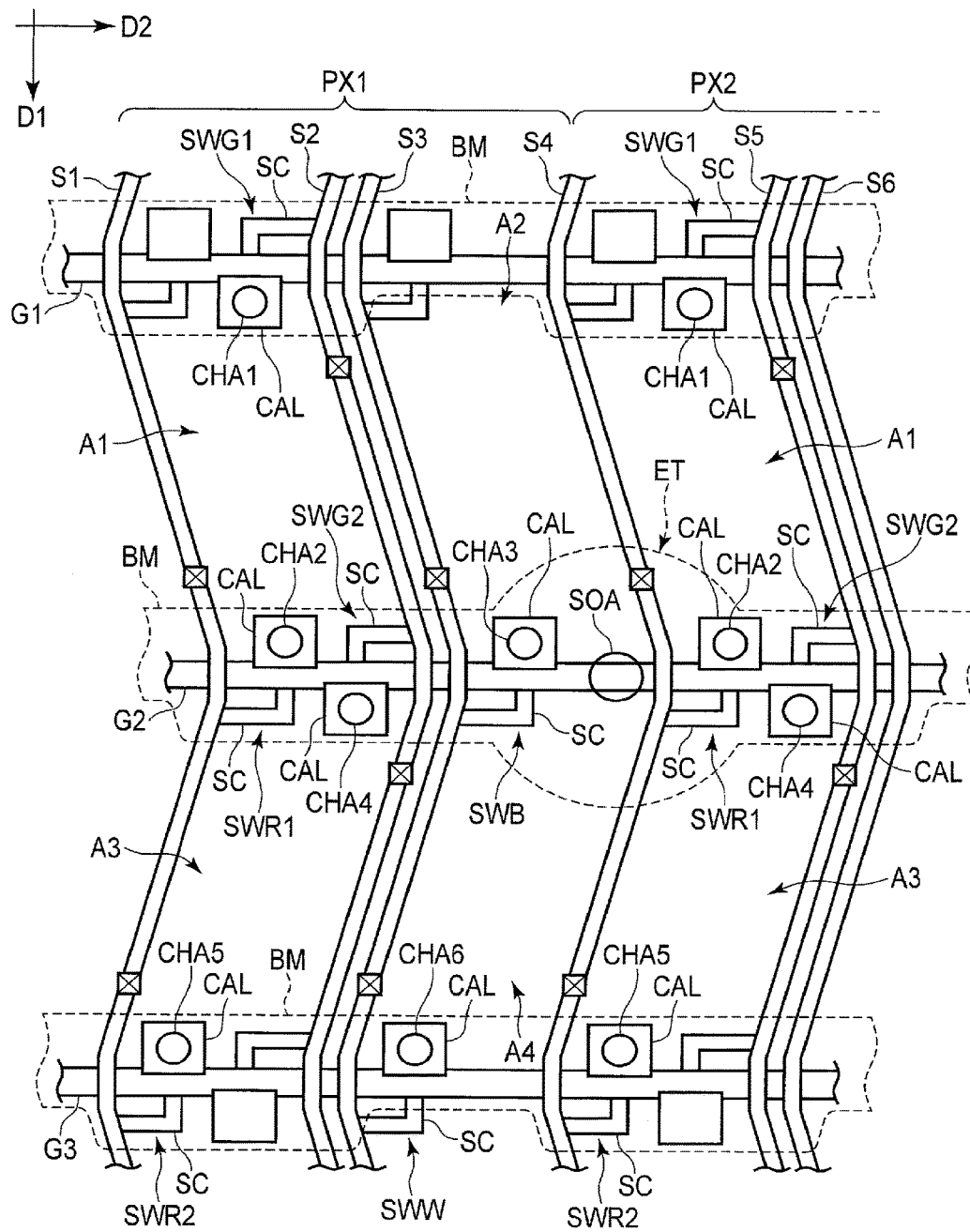
FIG. 10 is a plan view which shows a positional relationship between a light shielding layer of FIG. 7 and other elements.

FIG. 10 is a plan view which shows a positional relationship between the light-shielding layer BM of FIG. 7 and elements such as gate lines G (G1 to G3), source lines (S1 to S6), connection holes CHA1 to CHA6, and connection electrodes CAL.

The light-shielding layer BM is provided with each gate line G and extends in the second direction D2 along with gate line G. The light-shielding layer BM overlaps gate line G, connection holes CHA1 to CHA6, and connection electrodes CAL in a plan view.

The light-shielding layer BM prevents reflection of light from the second substrate SU2 side on corresponding gate line G and connection electrodes CAL and improves the display image quality. Note that, in the example of FIG. 10, source lines S are exposed from the light-shielding layer BM; however, color filters CFG1, CFG2, CFR1, CFR2, CFB, and CFW overlap each other in the proximity of source lines S as in FIG. 8, and light reflection by source lines S can be suppressed. Note that a light reflection protection may be applied to source lines S.

In the example of FIG. 10, spacer SOA is provided with a position overlapping gate line G2. Spacer SOA is positioning in the liquid crystal layer LQ to maintain the thickness of the liquid crystal layer LQ. Spacer SOA is formed of an organic resin material and is provided with the first substrate SU1 or the second substrate SU2.

The light-shielding layer BM has an enlarged part ET which is enlarged in size to overlap a circular range having a certain diameter with spacer SOA as the center. The enlarged part ET can prevent light leakage caused by disturbance in the alignment of liquid crystal molecules around spacer SOA. Furthermore, the first substrate SU1 and the second substrate SU2 may be shifted to be rubbed against each other around spacer SOA and may cause disturbance in the alignment of liquid crystal molecules. The enlarged part ET can prevent light leakage caused by such disturbance in the alignment.

Now, an example of effects achieved by the first embodiment will be explained.

FIG. 11 shows a comparative example of the first embodiment and shows pixels PXa arranged in the first direction D1. Pixel PXa includes red subpixel PXRa, green subpixel PXGa, and blue subpixel PXBa. Subpixels PXRa, PXGa, and PXBa are arranged in the second direction D2.

FIG. 12 shows color filters arranged on pixels PXa of FIG. 11. Continuous color filter CFRa is disposed to correspond to subpixels PXRa in the first direction D1, continuous color filter CFGa is disposed to correspond to subpixels PXGa in the first direction D1, and continuous color filter CFBa is disposed to correspond to subpixels PXBa in the first direction D1.

Here, subpixels PXRa, PXGa, and PXBa of the comparative example are prepared to have the same definition as in subpixels PXG1, PXG2, PXR1, PXR2, PXB, and PXW of the liquid crystal display device DSP of the first embodiment. In this case, pixel PXa of FIG. 11 includes three subpixels in the second direction D while pixels PX1 and PX2 of FIG. 3 or the like include only two subpixels in the second direction D2. Thus, pixel PXa has a width in the second direction D2 which is approximately 1.5 times the width in the second direction of each of pixels PX1 and PX2.

That is, with the structure of the first embodiment, a relatively large width can be secured for each pixel even if the definition of pixels is increased. Consequently, for example, color mixture of adjacent pixels can be prevented as detailed below.

The color mixture is a phenomenon which causes asymmetric polar angle dependency of a hue of a color displayed by a pixel. If the color mixture increases, a pixel displaying red is recognized as red when being viewed in a normal of the display surface while it may be recognized as greenish red when being viewed from an area of a high polar angle. The color mixture occurs when light incident on the display panel obliquely with respect to the normal direction of the main surface of the display panel passes through a color filter and a pixel area which are unmatched.

Figure 13:
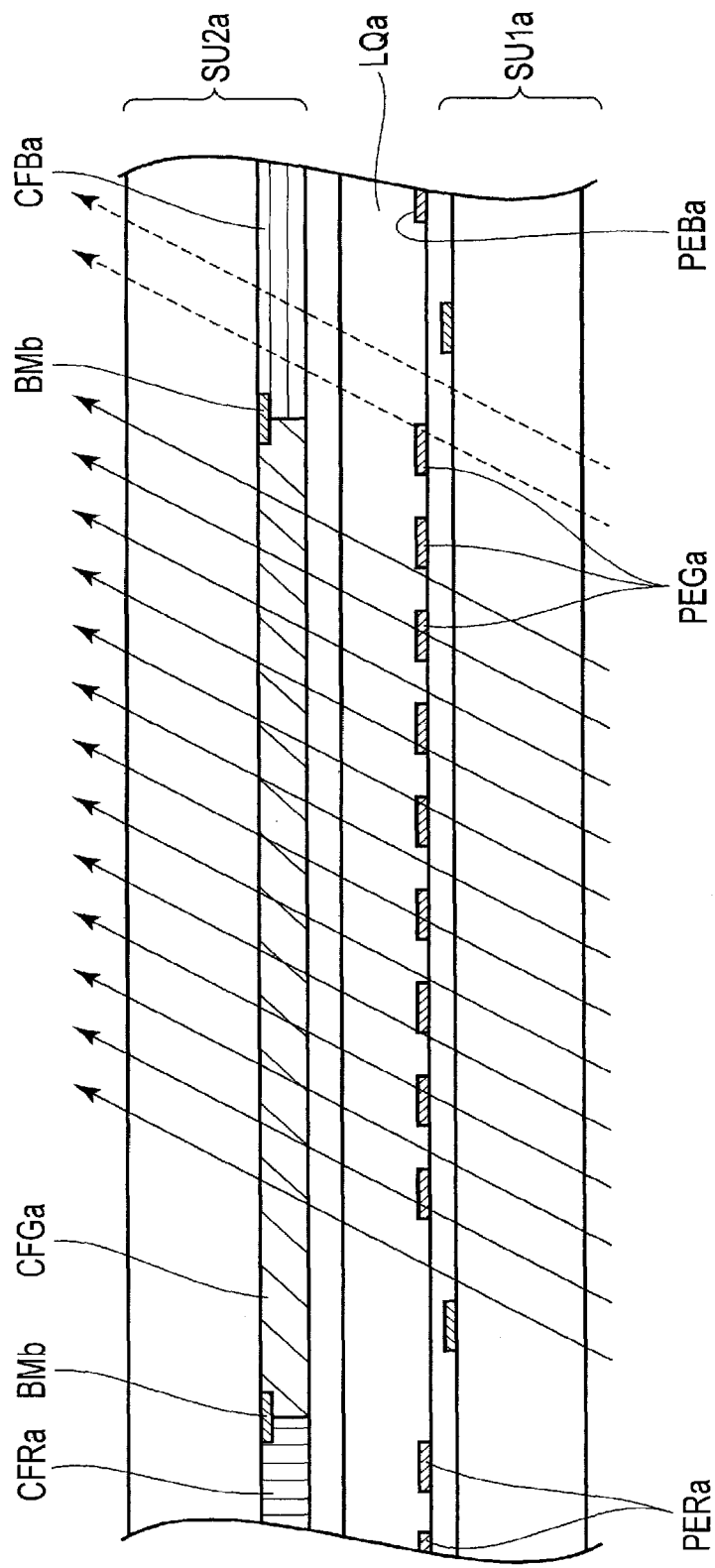
FIG. 13 is a cross-sectional view of a display panel in which pixel electrodes and color filters are disposed on different substrates.

FIG. 13 is a cross-sectional view of a display panel including pixel electrodes and color filters provided with different substrates. Pixel electrodes PERa, PEGa, and PEBa are provided with a first substrate SU1a, and color filters CFRa, CFGa, and CFBa are provided with a second substrate SU2a which is opposed to the first substrate SU1a with a liquid crystal layer LQa interposed therebetween where color filters CFRa, CFGa, and CFBa correspond to pixel electrodes PERa, PEGa, and PEBa, respectively. Furthermore, light-shielding layers BMb are provided with the second substrate SU2a to correspond to borders of subpixels. In the example of FIG. 13, first substrate SU1a and second substrate SU2a are attached to be a slightly shifted from their originally desired positions.

Here, a case where green subpixels corresponding to pixel electrodes PEGa and color filter CFGa are lit is given. Light from the backlight is obliquely incident on the first substrate SU1a and partly (as depicted in solid line arrows) passes through color filter CFGa to display green. On the other hand, light from the backlight is obliquely incident on the first substrate SU1a and partly (as depicted in dotted line arrows) passes through color filter CFBa of an adjacent pixel to display blue. Thus, the color mixture occurs.

Such mismatched light which passes through a color filter of an adjacent pixel causing the color mixture is observed at a border of pixels adjacent to each other. If the pixel size or the pixel width is greater, the large part of the light can pass through, the color filter of originally intended color, and such mismatched light is very rarely used in the display. Therefore, if the pixel size is increased, the possibility of recognition of the color mixture is decreased.

FIG. 14 shows a display panel with high definition pixels in which a pixel width is smaller than that of the example of FIG. 13. In that case, the pixel size is decreased in comparison with the example of FIG. 13. Therefore, a ratio of the mismatched light passing through color filters CFBa which is used for the display becomes relatively large. That is, if the pixel size is decreased, the color mixture tends to be more recognizable.

FIG. 15 shows a cross-sectional view of a display panel of a COA scheme in which pixel electrodes and color filters are disposed on the same substrate as in the first embodiment. That is, pixel electrodes PERa, PEGa, and PEBa and color filters CFRa, CFGa, and CFBa are formed on a first substrate SU1a.

Generally, tolerance in positioning between different substrates is approximately 2.5 µm which is large while tolerance in positioning between two different layers formed on the same substrate is approximately 1.0 µm which is very small. Therefore, in the example of FIG. 15, if there is a shift in the attachment process of the first substrate SU1a and the second substrate SU2a, a shift between pixel electrodes PERa, PEGa, and PEBa and color filters CFRa, CFGa, and CFBa can be suppressed. Furthermore, in the examples of FIGS. 13 and 14, a liquid crystal layer LQa is interposed between pixel electrodes PERa, PEGa, and PEBa and color filters CFRa, CFGa, and CFBa. Contrary, in the example of FIG. 15, there is not a liquid crystal layer interposed therebetween and the pixel electrodes and the color filters can be arranged closer. Thus, even if a shift occurs between pixel electrodes and color filters, a mismatch of lighting depicted by dotted line arrows as shown in FIGS. 13 and 14 does not easily occur. Therefore, the example of FIG. 15 is advantageous to prevent the color mixture. That is, the first embodiment in which the COA scheme is used can suppress the color mixture even if the display definition is increased more.

Furthermore, the display panel PNL of COA scheme as in the first embodiment achieves a good aperture ratio. That is, since the color mixture can be suppressed with the structure of COA scheme as described above, the area of the light-shielding layer BM disposed on the second substrate SU2 can be reduced. Specifically, a light shielding layer BM has been required to prevent light reflection by interconnections and the like and to reduce the color mixture when providing pixel electrodes and color filters with different substrates. The interconnections and the like here are the source lines S, gate lines G, and connection electrodes CAL. If a light shielding layer BM is provided with a border of pixels having a substantial rectangular shape, a light shielding layer is provided with each of a position on a long side of the pixel which is opposed to a source line, and a position on a short side of the pixel which is opposed to a gate line. In the COA scheme, the pixel electrodes and color filters are disposed on the same substrate to suppress the color mixture, and thus, the light shielding layer BM at the position opposed to the source line S can be omitted in each pixel. That is, light shielding layers along the long sides of pixels can be omitted, and thus, a decrease in the aperture ratio caused by a shift in the positioning of the first substrate SU1 and the second substrate SU2 can be suppressed and high aperture ratio can be achieved. With the improved aperture ratio, the brightness of the liquid crystal display device DSP can be improved.

Furthermore, a subpixel which is a component of a pixel is adjacent to other subpixels of different colors therein. In the example of the first embodiment, any subpixel which is a component of a pixel is surrounded by subpixels of different colors. That is, in the first embodiment in which the COA scheme is adopted, every color filter is adjacent to color filters of different colors, and ends of adjacent color filters overlap. In an overlap area where color filters of different colors overlap, the transmissivity of the light from the backlight unit is suppressed to a very low level in comparison with an area where a single color filter is disposed (including an area overlapping a pixel electrode). Thus, light shielding layers along borders of adjacent subpixels are not necessary or are decreased in size. Therefore, a decrease in the aperture ratio caused by a shift in the positioning of the first substrate SU1 and the second substrate SU2 can be suppressed.

Furthermore, although light shielding layers to be opposed to source lines S are omitted, undesired light reflection by source lines S can be suppressed by overlap areas of the color filters which are opposed to the source lines S. Therefore, even if the liquid crystal display device DSP is used in a bright condition, a decrease in visibility caused by external light reflection can be suppressed and a decrease in a contrast ratio can be suppressed.

As can be understood from the above, the present embodiment can present a high definition liquid crystal display device DSP with less color mixture and improved aperture ratio and a color filter substrate used in such a liquid crystal display device DSP.

In general, a color filter has a relatively large thickness of approximately 1.5 µm and is photoabsorbable, and thus, it is less suitable for a treatment. Therefore, if holes corresponding to connection holes CHA1 to CHA6 are provided with color filters CFG1, CFG2, CFR1, CFR2, CFB, and CFW in a color filter layer CFL, there is difficulty in forming such a hole with a small diameter. In this case, a residue may be produced in a connection hole formed after an etching process and electric connection through the connection hole may be blocked.

Thus, if holes corresponding to connection holes CHA1 to CHA6 are not provided with color filters CFG1, CFG2, CFR1, CFR2, CFB, and CFW as in the first embodiment, influence by the holes in the color filter treatment process can be suitably suppressed.

The third insulating layer IL3 is a transparent organic film and is prepared based on a positive resist which includes a solvent. Thus, the third insulating layer IL3 has certain fluidity immediately after its application. Therefore, the third insulating layer IL3 becomes thicker at positions with underlying color filters and becomes thinner at positions without any underlying color filter. However, a sufficient flattening effect may not be achieved sometimes and a cavity may be produced in a position without an underlying color filter. In the proximity of such a cavity, a gap between a connection electrode CAL and a common electrode CE formed on the surface of the third insulating layer IL3 on the liquid crystal layer LQ side is decreased and a parasitic capacitance may possibly be increased. In consideration of this point, recesses HG1, HG2, HR1, HR2, HB, and HW are provided with color filters CFG1, CFG2, CFR1, CFR2, CFB, and CFW in the first embodiment as shown in FIG. 9A, and connection holes CHA1 to CHA6 are formed to correspond to the positions of the recesses. Therefore, the area of a cavity can be decreased and parasitic capacitance can be decreased.

Moreover, since connection hole CHA1 is formed on the gate line G1 side while connection hole CHA2 is formed on the gate line G2 side, pixel electrodes PEG1 and PER1 can be disposed in a large space in area A1. Similarly, since connection hole CHA4 is formed on the gate line G2 side while connection hole CHA5 is formed on the gate line G3 side, pixel electrodes PEG2 and PER2 can be disposed in a large space in area A3. Therefore, a large area used for the display can be secured in each area and the display quality can be maintained even if the display definition is increased more.

Second Embodiment

Now, the second embodiment will be described. The structures and effects already described in the section related to the first embodiment will be omitted. The second embodiment has two ends of color filters overlap in a crossing point of a color filter layer instead of three overlapping ends in the first embodiment. In this respect, the second embodiment differs from the first embodiment.

Figure 16:
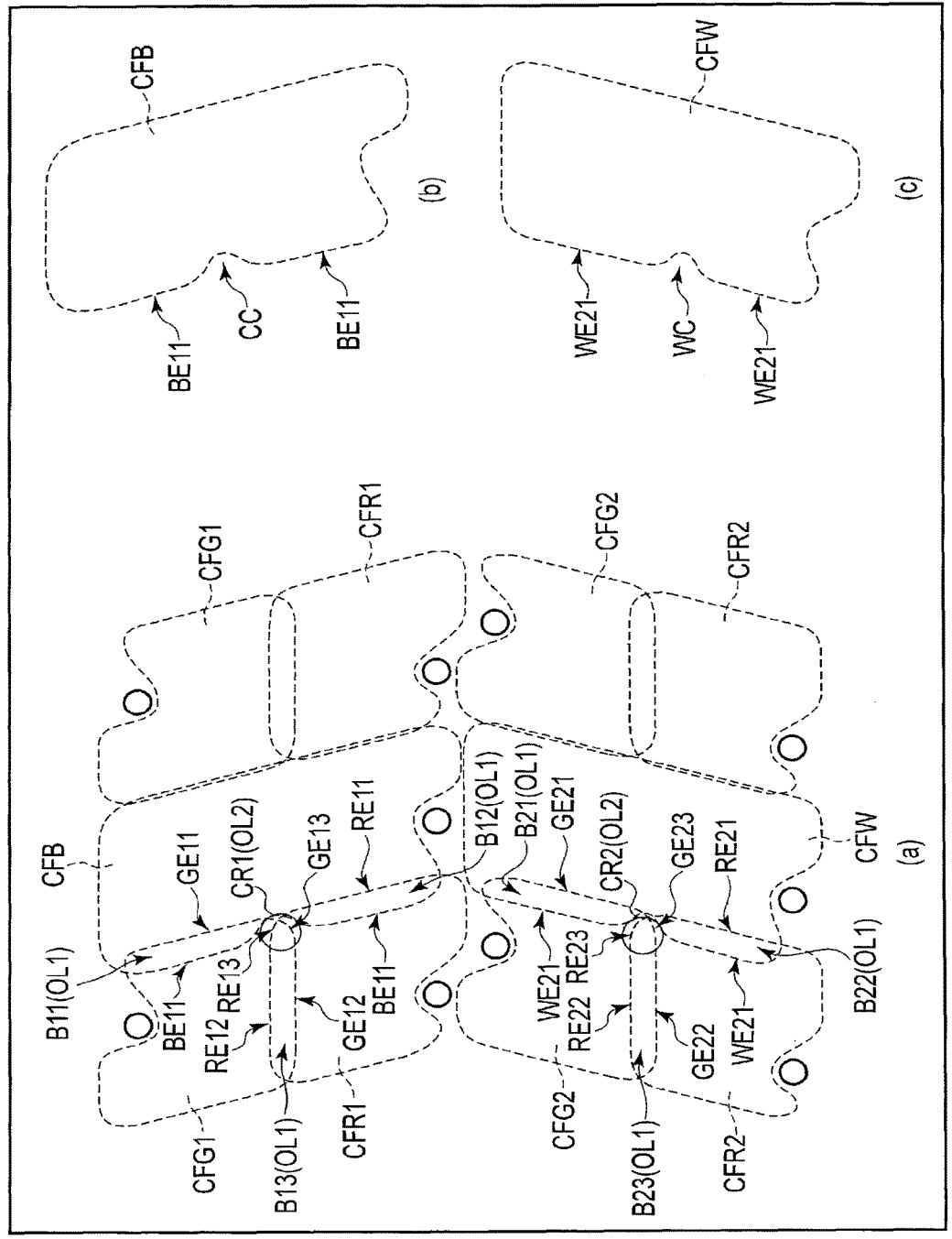
FIG. 16 shows color filters CFG1, CFG2, CFR1, CFR2, CFB, and CFW of a second embodiment.

FIG. 16 shows color filters CFG1, CFG2, CFR1, CFR2, CFB, and CFW of the second embodiment. In the figure, item (a) is a layout of color filters CFG1, CFG2, CFR1, CFR2, CFB, and CFW, item (b) shows color filter CFB, and item (c) shows color filter CFW.

As in the first embodiment, ends GE11 and BE11 overlap in border area B11, ends RE11 and BE11 overlap in border area B12, and ends GE12 and RE12 overlap in border area B13. Furthermore, ends GE21 and WE21 overlap in border area B21, ends RE21 and RE12 overlap in border area B13, and ends GE22 and RE22 overlap in border area B23. Border areas B11 to B13 and border areas B21 to B23 correspond to the first overlap area OL1.

At crossing point CR1, end GE13 of color filter CFG1 and end RE13 of color filter CFR1 overlap and color filter CFB does not. That is, as shown in item (b) of FIG. 16, color filter CFB has a cavity CC corresponding to the area of crossing point CR1.

Furthermore, at crossing point CR2, end GE23 of color filter CFG2 and end RE23 of color filter CFR2 overlap and color filter CFW does not. That is, as shown in item (c) of FIG. 16, color filter CFW has a cavity WC corresponding to the area of crossing point CR2. Crossing point CR1 and crossing point CR2 correspond to second overlap area OL2. Color filter CFW passes substantially all visible light and is thus unsuitable for a light shielding material, and therefore, color filter CFW should not overlap at crossing point CR2.

Therefore, a height difference between crossing point CR1 and border areas B11 to B13 can be reduced. Furthermore, a height different between crossing point CR2 and border areas B21 to B23 can be reduced. Therefore, as explained above with reference to FIG. 9B, the liquid crystal layer in the areas opposed to the border areas and the crossing points can have a substantially even thickness and a decrease in transmissivity caused by a local decrease in percentage modulation can be suppressed.

Figure 17:
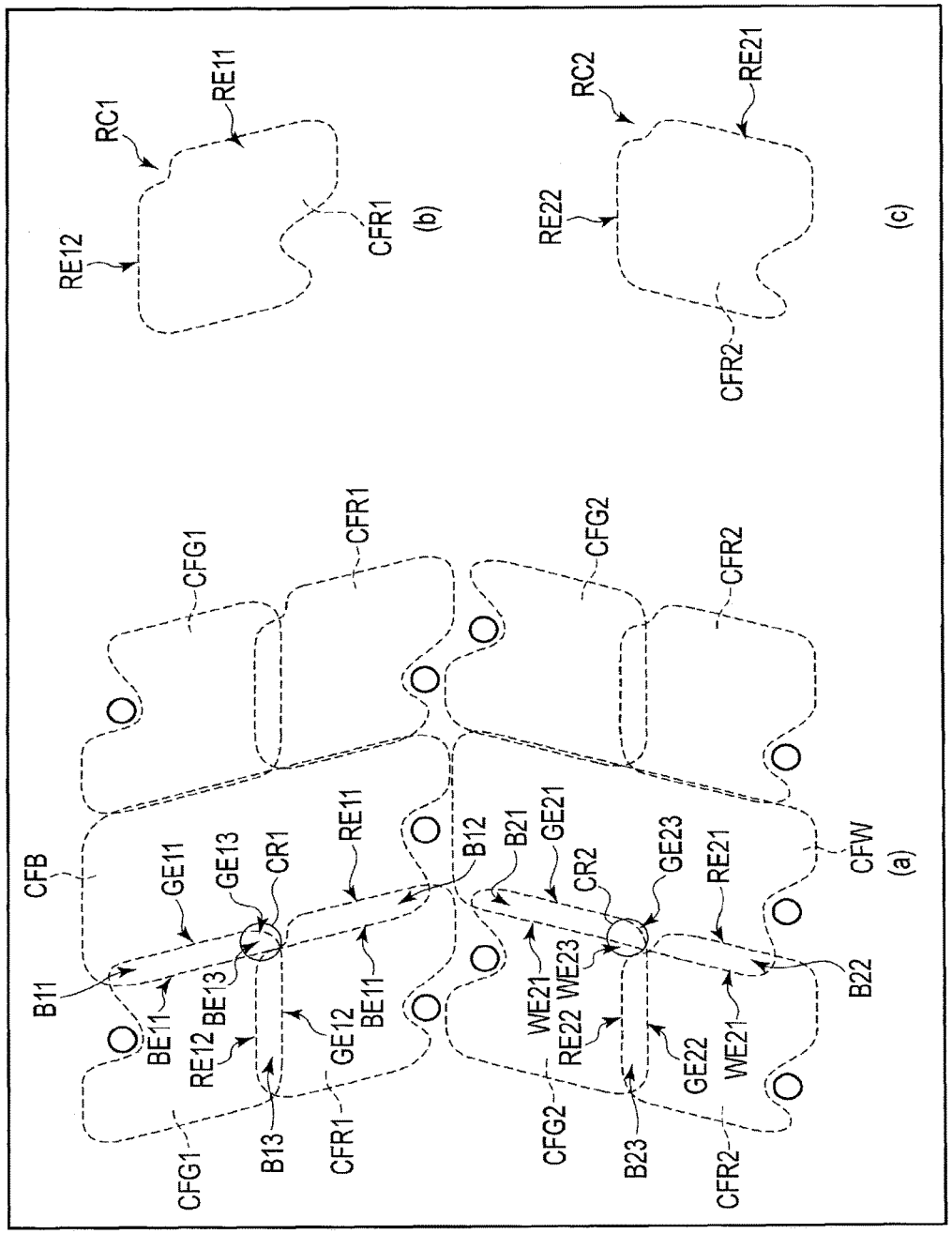
FIG. 17 shows color filters CFG1, CFG2, CFR1, CFR2, CFB, and CFW of the second embodiment.

FIG. 17 shows color filters CFG1, CFG2, CFR1, CFR2, CFB, and CFW of the second embodiment. In the figure, item (a) is a layout of color filters CFG1, CFG2, CFR1, CFR2, CFB, and CFW, item (b) shows color filter CFR1, and item (c) shows color filter CFR2.

In comparison with the example of FIG. 16, the example of FIG. 17 has different overlap structures at crossing point CR1 and crossing point CR2. Other overlap structures of border areas B11 to B13 and border areas B21 to B23 are the same and explanation thereof is omitted.

At crossing point CR1, end GE13 of color filter CFG1 and end BE13 of color filter CFB overlap and color filer CFR1 does not. That is, as shown in item (b) of FIG. 17, color filter CFR1 has a cavity RC1 corresponding to the area of crossing point CR1. Cavity RC1 is formed in an area where ends RE11 and RE12 cross. Furthermore, at crossing point CR2, end GE23 of color filter CFG2 and end WE23 of color filter CFW overlap and color filter CFR2 does not. That is, as shown in item (c) of FIG. 17, color filter CFR2 has cavity RC2 corresponding to the area of crossing point CR2. Cavity RC2 is formed in an area where ends RE21 and RE22 cross. Crossing point CR1 and crossing point CR2 correspond to the second overlap area OL2.

In this example, the same advantage as in the example of FIG. 16 can be achieved.

Figure 18:
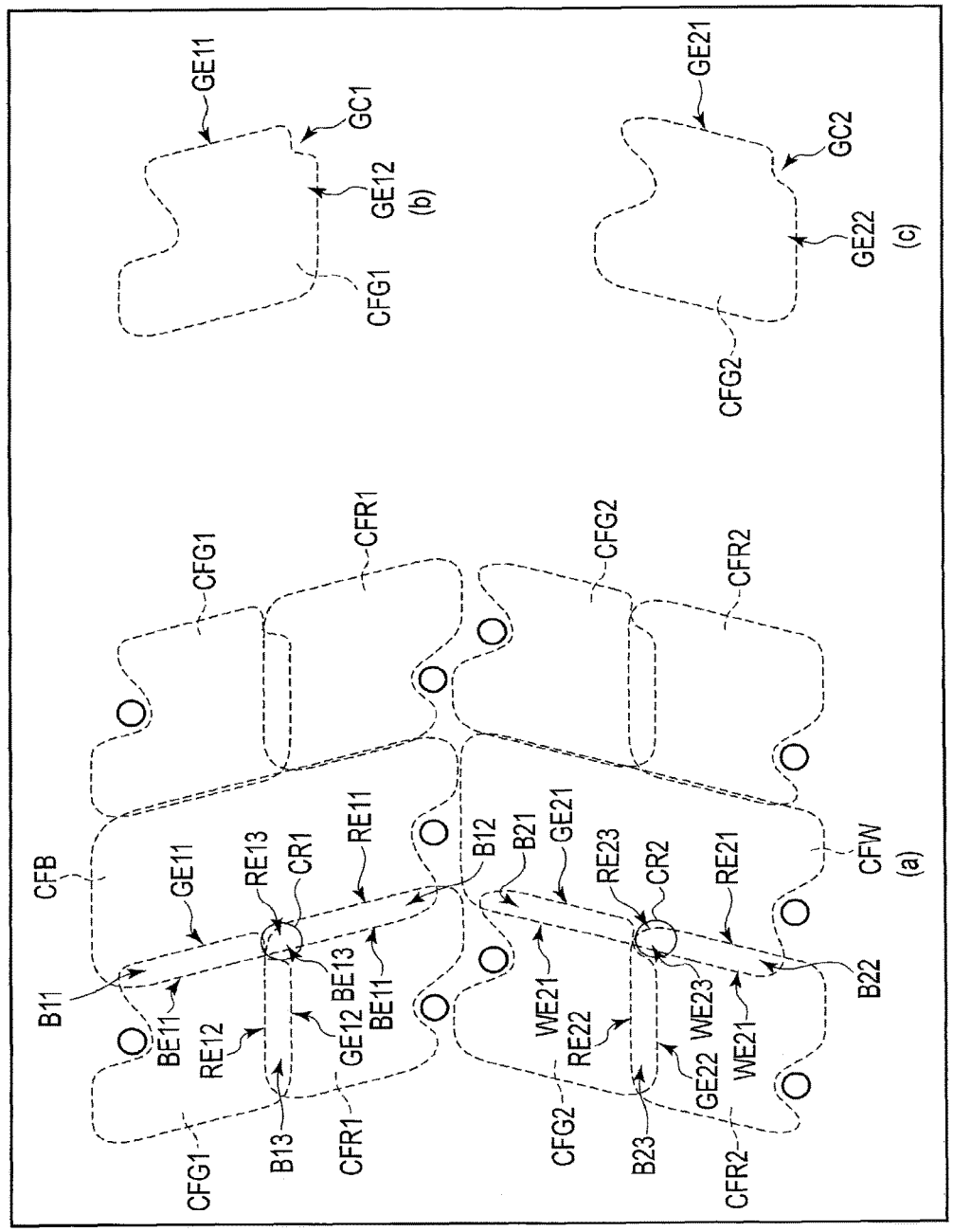
FIG. 18 shows color filters CFG1, CFG2, CFR1, CFR2, CFB, and CFW of the second embodiment.

FIG. 18 shows color filters CFG1, CFG2, CFR1, CFR2, CFB, and CFW of the second embodiment. In the figure, item (a) is a layout of color filters CFG1, CFG2, CFR1, CFR2, CFB, and CFW, item (b) shows color filter CFG1, and item (c) shows color filter CFG2.

In comparison with the example of FIG. 16, the example of FIG. 18 has different overlap structures at crossing point CR1 and crossing point CR2. Other overlap structures of border areas B11 to B13 and border areas B21 to B23 and advantages obtained therefrom are the same and explanation thereof is omitted.

Third Embodiment

Now, the third embodiment will be described. The structures and effects already described in the section related to the first embodiment will be omitted. The third embodiment focuses on the area where green filter CFG2, red filter CFR2, and white or substantially transparent color filter CFW are adjacent to each other. The third embodiment has color filters of at least two colors having different transmissivity peaks in the visible radiation in border areas B21 and B22 and crossing point CR2. In this respect, the third embodiment differs from the second embodiment. Note that border areas B11 and B12 and crossing point CR1 may be formed as in the first embodiment, or may be formed as in the second embodiment.

Figure 19:
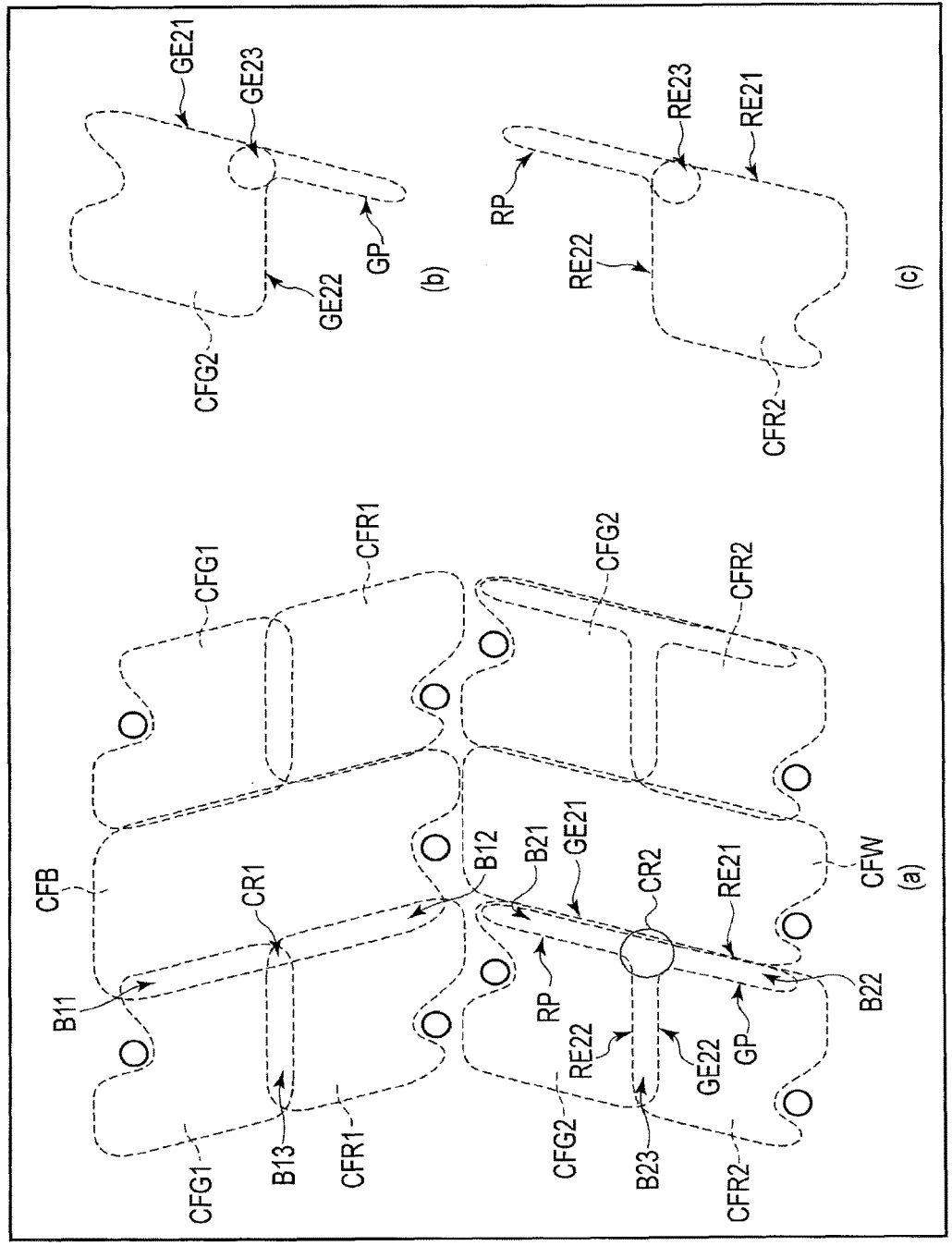
FIG. 19 shows color filters CFG1, CFG2, CFR1, CFR2, CFB, and CFW of a third embodiment.

FIG. 19 shows color filters CFG1, CFG2, CFR1, CFR2, CFB, and CFW of the third embodiment. In the figure, item (a) is a layout of color filters CFG1, CFG2, CFR1, CFR2, CFB, and CFW, item (b) shows color filter CFG2, and item (c) shows color filter CFR2.

In border areas B21 to B23 and crossing point CR2, ends of color filter CFG2 and ends of color filter CFR2 overlap and color filter CFW does not. That is, as shown in item (b) of FIG. 19, color filter CFG2 has a projection GP extending from end GE23 in addition to ends GE21 to GE23. Furthermore, as shown in item (c) of FIG. 19, color filter CFR2 has a projection RP extending from end RE23 in addition to ends RE21 to RE23. End GE21 and projection RP overlap in border area B21. End RE21 and projection GP overlap in border area B22. Ends GE22 and RE22 overlap in border area B23. Ends GE23 and RE23 overlap at crossing point CR2.

Therefore, a height different between crossing point CR2 and border areas B21 to B23 can be reduced. Therefore, as explained above with reference to FIG. 9B, the liquid crystal layer in the areas opposed to the border areas and the crossing points can have a substantially even thickness and a decrease in transmissivity caused by a local decrease in percentage modulation can be suppressed.

Furthermore, as explained above with reference to FIG. 8, border areas B21 and B22 and crossing point CR2 are opposed to source lines S2 and S3. In the border areas and crossing point, color filters of at least two colors having different transmissivity peaks in the visible radiation overlap, and thus, undesired light reflection by source lines S2 and S3 can be suppressed. Therefore, a decrease in a contrast ratio can be suppressed. Furthermore, in the present embodiment, a white or colorless color filter CFW which passes substantially all visible light is not formed in the border areas or crossing point, and thus, the whole thickness of the color filter CF can be reduced.

Figure 20:
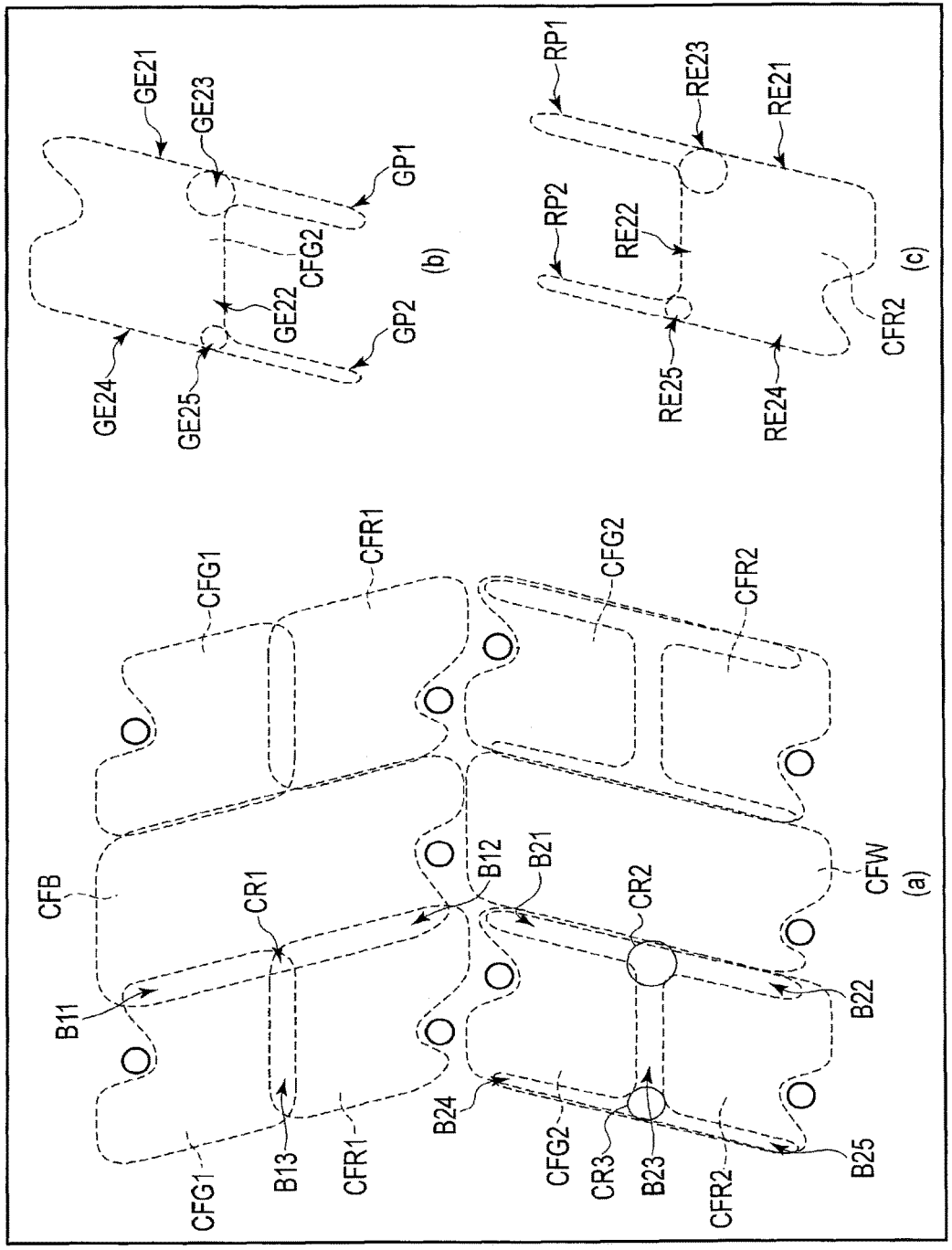
FIG. 20 shows color filters CFG1, CFG2, CFR1, CFR2, CFB, and CFW of the third embodiment.

FIG. 20 shows color filters CFG1, CFG2, CFR1, CFR2, CFB, and CFW of the third embodiment. In the figure, item (a) is a layout of color filters CFG1, CFG2, CFR1, CFR2, CFB, and CFW, item (b) shows color filter CFG2, and item (c) shows color filter CFR2.

In comparison with the example of FIG. 19, the example of FIG. 20 has ends of two color filters overlapping in border areas B24 and B25 and crossing point CR3 in addition to border areas B21 to B23 and crossing point CR2. Note that border areas B24 and B25 and crossing point CR3 are opposed to source lines S1.

In border areas B21 to B23 and crossing point CR2, ends of color filter CFG2 and ends of color filter CFR2 overlap and color filter CFW does not. Furthermore, in border areas B24 and B25 and crossing point CR3, ends of color filter CFG2 and ends of color filter CFR2 overlap.

That is, as shown in item (b) of FIG. 20, color filter CFG2 has, in addition to ends GE21 to GE23, projection GP1 extending from end GE23, end GE24 opposite to end GE21, end GE25 opposite to end GE23 with end GE22 interposed therebetween, and projection GP2 extending from end GE25. Projection GP1 is wider than projection GP2. As shown in item (c) of FIG. 20, color filter CFR2 has, in addition to ends RE21 to RE23, projection RP1 extending from end RE23, end RE24 opposite to end RE21, end RE25 opposite to end RE23 with end RE22 interposed therebetween, and projection RP2 extending from end RE25. Projection RP1 is wider than projection RP2.

End GE21 and projection RP1 overlap in border area B21. End RE21 and projection GP1 overlap in border area B22. Ends GE22 and RE22 overlap in border area B23. Ends GE23 and RE23 overlap at crossing point CR2. End GE24 and projection RP2 overlap in border area B24. End RE24 and projection GP2 overlap in border area B25. Ends GE25 and RE25 overlap at crossing point CR3.

Advantages achieved thereby are substantially the same as that of the example of FIG. 19, and thus the explanation thereof is omitted.

Figure 21:
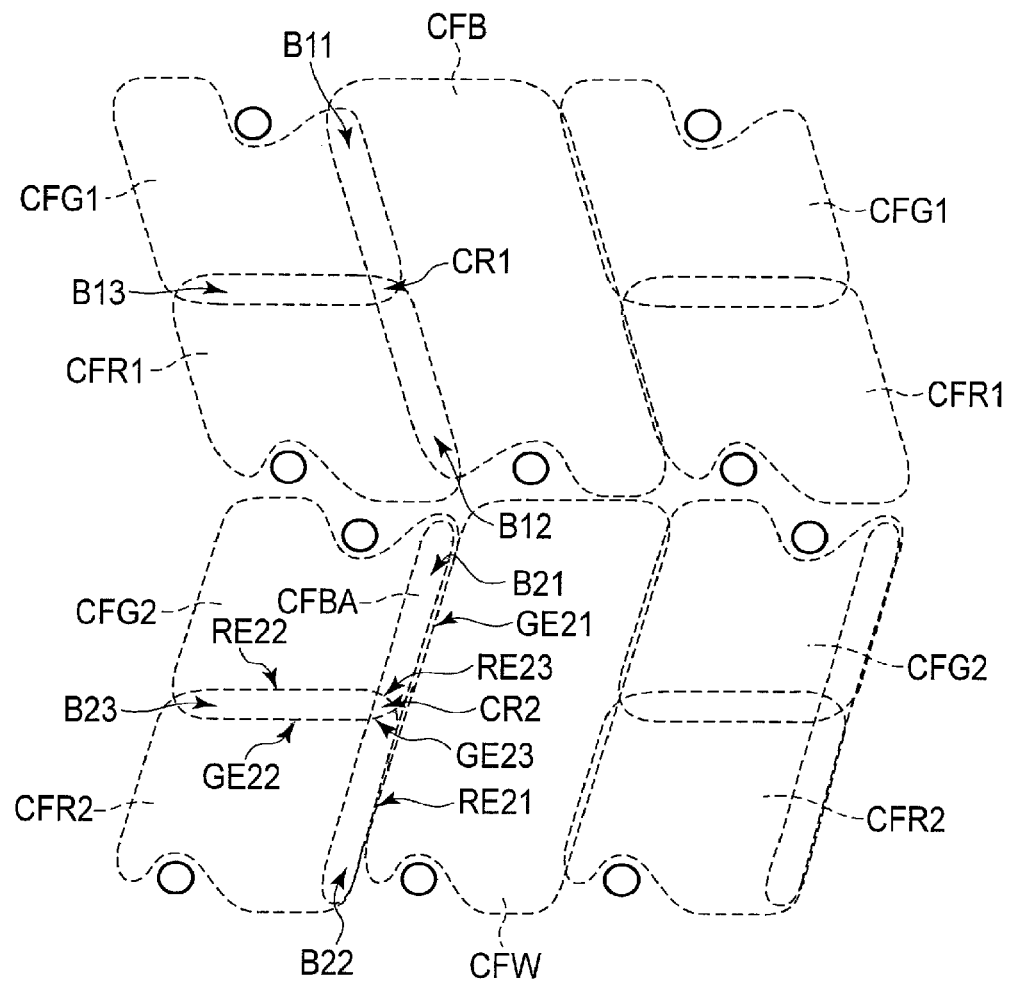
FIG. 21 shows color filters CFG1, CFG2, CFR1, CFR2, CFB, and CFW of the third embodiment.

FIG. 21 shows color filters CFG1, CFG2, CFR1, CFR2, CFB, and CFW of the third embodiment.

In comparison with the example of FIG. 19, the example of FIG. 20 has different overlap structures in border areas B21 and B22 and crossing point CR2. That is, in border areas B21 and B22 and crossing point CR2, an island-shaped blue filter CFBA is disposed separately from blue filter CFB. Note that color filter CFBA may be formed integrally with color filter CFB.

End GE21 and color filter CFBA overlap in border area B21. End RE21 and color filter CFBA overlap in border area B22. Ends GE22 and RE22 overlap in border area B23. Ends GE23 and RE23 and color filter CFBA overlap at crossing point CR2. Color filter CFW does not overlap with any other end or filter in border areas B21 and B22 and crossing point CR2. Note that the overlap order of the color filters is as explained above with reference to FIG. 9B, and color filter CFBA should be disposed above color filters CFG2 and CFR2.

In this example, undesired light reflection by source lines S1 to S3 can be suppressed more in comparison with a case where red filter CFR2 and green filter CFG2 overlap in border areas B21 and B22 and crossing point CR2. Therefore, a decrease in the contrast ratio can be suppressed.

Figure 22:
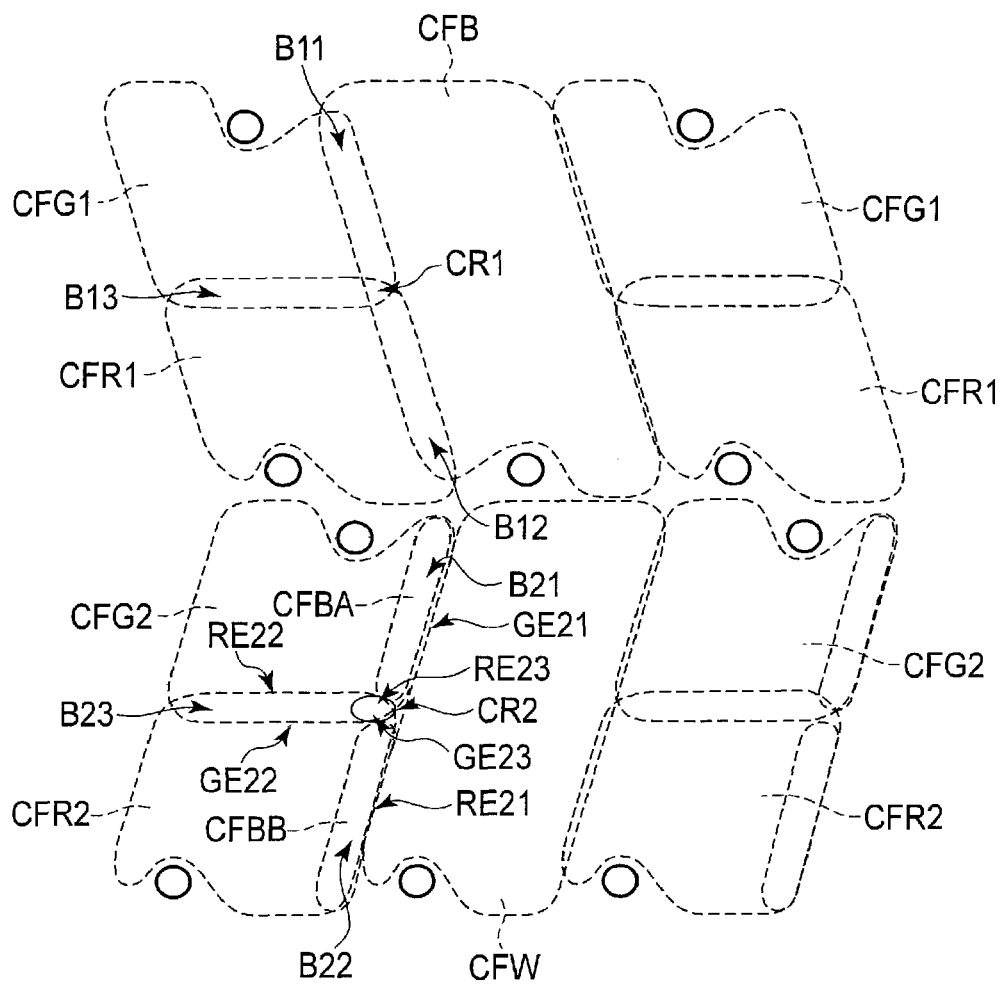
FIG. 22 shows color filters CFG1, CFG2, CFR1, CFR2, CFB, and CFW of the third embodiment.

FIG. 22 shows color filters CFG1, CFG2, CFR1, CFR2, CFB, and CFW of the third embodiment.

In comparison with the example of FIG. 21, the example of FIG. 22 has different overlap structures at crossing point CR2. That is, an island-shaped blue filter CFBA is disposed in border area B21 and an island-shaped blue filter CFBB is disposed in border area B22. Color filters CFBA and CFBB are not disposed at crossing point CR2.

End GE21 and color filter CFBA overlap in border area B21. End RE21 and color filter CFBB overlap in border area B22. Ends GE22 and RE22 overlap in border area B23. Ends GE23 and RE23 overlap at crossing point CR2. Color filter CFW does not overlap with any other end or filter in border areas B21 and B22 and crossing point CR2.

In this example, undesired light reflection by source lines S1 to S3 can be suppressed more in comparison with a case where red filter CFR2 and green filter CFG2 overlap in border areas B21 and B22 and crossing point CR2. Therefore, a decrease in the contrast ratio can be suppressed.

Furthermore, a height different between crossing point CR2 and border areas B21 to B23 can be reduced. Therefore, as explained above with reference to FIG. 9B, the liquid crystal layer in the areas opposed to the border areas and the crossing points can have a substantially even thickness and a decrease in transmissivity caused by a local decrease in percentage modulation can be suppressed.

As explained above, the embodiments of the present application can present a color filter substrate and a display device suitable for higher definition standards.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A color filter substrate comprising:
an insulating substrate;
a pixel area formed on the insulating substrate and including a plurality of pixels;
a first switching element, a second switching element, and a third switching element formed in the pixel area;
a first pixel electrode formed on the insulating substrate and electrically connected to the first switching element in the pixel area;
a second pixel electrode formed on the insulating substrate and electrically connected to the second switching element in the pixel area;
a third pixel electrode formed on the insulating substrate and electrically connected to the third switching element in the pixel area;
a first color filter of a first color disposed between the first pixel electrode and the insulating substrate;
a second color filter of a second color which is different from the first color, the second color filter disposed between the second pixel electrode and the insulating substrate; and
a third color filter of a third color which is different from the first color and the second color, the third color filter disposed between the third pixel electrode and the insulating substrate, wherein
the first pixel electrode is adjacent to the second pixel electrode in a first direction, and the third pixel electrode is adjacent to the first pixel electrode and the second pixel electrode in a second direction crossing the first direction,
wherein the first color filter and the second color filter overlap each other in a first overlap area that extends in a second direction, the first color filter and the third color filter overlap each other in a second overlap area that extends in a first direction, the second color filter and the third color filter overlap each other in a third overlap area that extends in the first direction, and the second and third overlap areas are adjacent to each other in the first direction.

2. The color filter substrate of claim 1, wherein the second overlap area is positioned at a crossing point where a first border area between the first pixel electrode and the third pixel electrode, a second border area between the second pixel electrode and the third pixel electrode, and a third border area between the first pixel electrode and the second pixel electrode cross each other.

3. The color filter substrate of claim 1, wherein one of the first color and the second color is red and the other is green, and the third color is blue.

4. The color filter substrate of claim 3, wherein an area of the third color filter is greater than each area of the first color filter and the second color filter.

5. The color filter substrate of claim 3, wherein the third color filter is more distant from the insulating substrate than the first color filter and the second color filter in the first overlap area.

6. The color filter substrate of claim 1, further comprising:
a fourth switching element formed in the pixel area;
a fourth pixel electrode electrically connected to the fourth switching element in the pixel area; and
a fourth color filter which is substantially transparent, the fourth color filter disposed between the fourth pixel electrode and the insulating substrate, wherein
the first pixel electrode, the second pixel electrode, and the fourth pixel electrode are adjacent to each other.

7. The color filter substrate of claim 6, wherein the third color filter is more distant from the insulating substrate than the first color filter in a first border area, and
the third color filter is more distant from the insulating substrate than the second color filter in a second border area.

8. The color filter substrate of claim 6, wherein the first color and the second color are selected from red, green, and blue.

9. The color filter substrate of claim 6, wherein an area of the fourth color filter is greater than an area of the first color filter and an area of the second color filter.

10. A display device comprising the color filter substrate of claim 1 and a second substrate opposed to the color filter substrate.

11. A display device comprising a color filter substrate of claim 6 and a second substrate opposed to the color filter substrate.

* * * * *